(12) United States Patent
Ishio et al.

(10) Patent No.: US 6,448,624 B1
(45) Date of Patent: Sep. 10, 2002

(54) SEMICONDUCTOR ACCELERATION SENSOR

(75) Inventors: Seiichiro Ishio, Handa; Kenichi Ao, Tokai; Minoru Murata, Kariya; Yasuki Shimoyama, Nukata-gun; Tomohito Kunda, Nukata-gun; Norio Kitao, Nukata-gun, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 08/908,939

(22) Filed: Aug. 8, 1997

(30) Foreign Application Priority Data

| Aug. 9, 1996 | (JP) | ................................. 8-211086 |
| Aug. 9, 1996 | (JP) | ................................. 8-211088 |
| Aug. 9, 1996 | (JP) | ................................. 8-211089 |
| Aug. 30, 1996 | (JP) | ................................. 8-230731 |
| Aug. 30, 1996 | (JP) | ................................. 8-230732 |
| Apr. 4, 1997 | (JP) | ................................. 9-086331 |

(51) Int. Cl.$^7$ ................................................ H01L 29/82
(52) U.S. Cl. ..................... 257/417; 257/414; 257/415; 257/416; 257/418; 257/419; 257/420; 438/50
(58) Field of Search .................... 257/414, 415, 257/416, 417, 418, 419, 420; 438/50

(56) References Cited

U.S. PATENT DOCUMENTS

| 5,115,292 A | * | 5/1992 | Takebe et al. ............... 357/26 |
| 5,231,879 A | * | 8/1993 | Yamamoto .................... 73/517 |
| 5,408,112 A | | 4/1995 | Tai et al. |
| 5,447,067 A | * | 9/1995 | Biebl et al. ............... 73/514.32 |
| 5,483,106 A | | 1/1996 | Echigo et al. |
| 5,572,057 A | * | 11/1996 | Yamamoto et al. ......... 257/417 |
| 5,619,050 A | * | 4/1997 | Uenoyama et al. ......... 257/254 |
| 5,627,397 A | * | 5/1997 | Kano et al. ................ 257/417 |
| 5,656,846 A | * | 8/1997 | Yamada ..................... 257/420 |
| 5,773,881 A | * | 6/1998 | Kato .......................... 257/685 |
| 5,844,286 A | * | 12/1998 | Hase .......................... 257/417 |
| 5,864,062 A | * | 1/1999 | Nagahara et al. ......... 73/514.01 |

FOREIGN PATENT DOCUMENTS

| JP | 4-186676 | * | 7/1992 | ................. 257/414 |
| JP | 4-186884 | * | 7/1992 | ................. 257/414 |
| JP | 4 274005 | | 9/1992 | |
| JP | 5-7006 | * | 1/1993 | ................. 257/415 |
| JP | 5 333051 | | 12/1993 | |
| JP | 7 280832 | | 10/1995 | |
| JP | 8 122358 | | 5/1996 | |

* cited by examiner

*Primary Examiner*—Mahshid Saadat
*Assistant Examiner*—Edgardo Ortiz
(74) *Attorney, Agent, or Firm*—Pillsbury Madison & Sutro LLP

(57) ABSTRACT

A semiconductor sensor chip is provided with a weight portion supported in a frame via beams whereby acceleration up to substantially ±1 G can be detected by utilizing piezoresistance effect of resistor elements formed on the beams. The semiconductor sensor chip is supported by a seat having a thermal expansion coefficient equivalent to that of the semiconductor sensor chip via the frame. The frame and the seat are adhered to each other by a flexible adhesive agent mixed with a plurality of resin beads functioning as spacers and under an adhesion state, air damping of the weight portion is carried out by setting a dimension of an air gap between the weight portion and the seat to a range of 7 through 15 $\mu$m.

50 Claims, 22 Drawing Sheets

SEMICONDUCTOR ACCELERATION SENSOR

CROSS REFERENCE TO RELATED APPLICATION

This application is based upon and claims priority from Japanese Patent Applications No. 8-211086 filed Aug. 9, 1996, No. 8-211088 filed Aug. 9, 1996, No. 8-211089 filed Aug. 9, 1996, No. 8-230731 filed Aug. 30, 1996, No. 8-230732 filed Aug. 30, 1997, and No. 9-86331 filed Apr. 4, 1997, the contents of which are incorporated herein by reference.

BACKGROUND OF THE INVENTION

1. Field of the Invention

The present invention relates to a semiconductor acceleration sensor for detecting acceleration by utilizing a semiconductor material having a large piezoresistance coefficient, particularly to a semiconductor acceleration sensor that is constituted to be able to detect acceleration at a comparatively low level of substantially ±1 G or smaller.

2. Description of Related Art

There is a semiconductor acceleration sensor that is formed into a shape where a weight portion dislocated by receiving acceleration is supported by an outer frame via beams at which diffused resistors are formed, by etching a silicon substrate. According to this sensor, when acceleration is applied thereon, the weight portion is dislocated by receiving a force proportional to the acceleration and therefore, the beams supporting the weight portion are distorted by which resistance values of the diffused resistors are changed through a piezoresistance effect in response to stresses caused by the distortion. The change of the resistance value can be detected as a voltage signal by forming a detecting circuit where the diffused resistors are connected in a bridge connection and the applied acceleration can be detected based on the voltage signal.

Meanwhile, such a semiconductor acceleration sensor is used for detecting, for example, a vehement impact that occurs in a case of an automobile collide. Because this semiconductor acceleration sensor detects the degree of impact received by a detected portion as a magnitude of acceleration, acceleration to be detected has a large acceleration value which exceeds 10 G (G is a gravitational acceleration of 9.8 m/sec$^2$).

Meanwhile, it has been requested in recent years for an automobile or the like to achieve promotion of safety by carrying out braking control or the like by detecting a very small acceleration to a degree of level of acceleration or deceleration caused in a normal running state, which is far smaller than the acceleration caused by impact as described above. Accordingly, an acceleration sensor capable of accurately detecting an acceleration having a range from substantially ±1 G to at least substantially ±2 G as a range of acceleration to be detected has been requested.

However, such a semiconductor acceleration sensor for detecting a very small acceleration has the following technological problem. That is, a very small force which the weight portion of the sensor chip receives by acceleration, is caused as strain of the beams and accordingly, when the beams receives a force even slightly through the frame portion to which a sensor chip per se is fixed, stresses are caused in the beams supporting the weight portion and the diffused resistors on the beams are applied with stresses by which adverse influence may be effected on the detecting operation, such as variation of the sensitivity of detection.

In order to deal with such a drawback, according to a semiconductor acceleration sensor having a small detection range of from ±1 G to ±2 G as the detection range of acceleration, a structure for reducing as less as possible stresses received from a substrate, is adopted and an outline of the structure is shown, for example, in FIG. 44 and FIG. 45. That is, a semiconductor sensor chip 1 made of silicon is formed in a state where a sensor element 3 is supported by a cantilever 4 in a first frame 2 which constitutes an outer frame.

The sensor element 3 is constituted by a second frame in an U-like shape, four beams 6a through 6d extended from the second frame 5 and a weight portion 7 supported by the four beams 6a through 6d. Diffused resistors are previously formed at the four beams 6a through 6d where resistances thereof are varied by the piezoresistance effect when they receive distortion. Further, the diffused resistors are wired in a bridge connection whereby a change in the resistance can be outputted as a voltage signal.

According to the semiconductor sensor chip 1, the first frame 2 is fixed to a seat 8 made of glass by anodic bonding. A recess 8a is formed in the seat 8 on a side thereof more inner than a portion thereof facing to the first frame 2 by which even if the weight portion 7 is deformed it is not brought into contact with the recess 8a. The seat 8 made of glass is bonded and fixed to a substrate 9 made of ceramic. An IC chip 10 for carrying out signal processing of an output from the sensor is attached to the substrate 9 by die bonding and the IC chip 10 and the semiconductor sensor chip 1 are electrically connected by a bonding wire 11.

The substrate 9 to which the semiconductor sensor chip 1 is fixedly adhered via the seat 8, is arranged in a case 12 comprising a base 12a and a cap 12b. Oil 13 is filled in the case 12 as a damper material for preventing the device from destructing when an excessive acceleration is applied thereon. A lead, not shown, electrically connected to the semiconductor sensor chip 1 or the IC chip 10 is extended from the case 12 to outside by which a detection signal is outputted.

According to the above-described constitution, when the semiconductor sensor chip 1 receives an acceleration orthogonal to a face thereof, the weight portion 7 is dislocated in a direction opposed to the acceleration by a force at that moment, whereby the diffused resistors formed at the beam 6a through 6d are applied with a distortion in accordance with the acceleration. Then, an output voltage of a circuit in a bridge connection is varied by the piezoresistance effect of the diffused resistors and accordingly, the applied acceleration can be detected.

However, by adopting such a structure, the portion of the first frame 2 needs to be constituted extraneously in addition to essential portions for detecting acceleration according to the semiconductor acceleration sensor 1 and therefore, it is inevitable to increase the chip size by the first frame 2. As a result, the portion of the first frame 2 becomes a hindrance for downsizing a total size of the sensor.

Further, according to the above-described sensor, a seal mechanism for preventing leakage of the oil 13 is needed and the like, which gives rise to general complication of the structure.

Moreover, there has been in recent years an increase in needs for detecting acceleration at a comparatively low level of substantially 1 G or lower in the usage of ABS (Antilock Braking System) or a device for preventing transverse skidding in curving operation of an automobile, however, according to the conventional acceleration sensor utilizing oil damping as mentioned above, it is difficult to sufficiently lower the detectable acceleration.

That is, the conventional sensor has a drawback where stable detecting operation may not be carried out due to the oil 13 filled in the case 12 as a damper material whereby the temperature range in use may be limited or detection error may be enlarged.

For example, according to a result of actual measurement of a degree of varying sensitivity (which indicates as a value of percentage a degree of varying sensitivity in a case where the sensitivity is defined as a value of a difference between output voltages when acceleration is 0 G and when it is 1 G) in the above-described structure in the case where the temperature range for use is as wide as from substantially −30° C. to 85° C., a dispersion of about −2.5% as a minimum value and about '1% as a maximum value is caused. Therefore, since the degree of varying sensitivity that is practically necessary in accurately measuring acceleration of substantially ±1 G in the above-described temperature range for use, is about 1 through 2% and therefore, there causes a case where such a condition cannot be satisfied.

Next, an investigation has been performed on a semiconductor acceleration sensor having a structure capable of responding to the needs for detecting acceleration at a comparatively low level of substantially ±1 G or lower after resolving the above-described problems once for all by making free use of micro machining technology.

Specifically., a semiconductor sensor chip is mounted on a seat made by a material having a thermal expansion coefficient equivalent to that of the material of the chip (preferably the same material), whereby adverse influence caused by a distortion due to a difference in the thermal expansion coefficients of both is eliminated. Further, air damping for a weight portion is carried out by an air gap formed between the weight portion and the seat, whereby simplification of structure is realized by dispensing with the oil 13 and a seal structure thereof as shown in FIG. 45 and further, the acceleration at a comparatively low level of substantially ±1 G or lower can be detected by enhancing an accuracy in fabricating beams and the like.

When a semiconductor acceleration sensor having such a structure was actually fabricated, and an output characteristic thereof, particularly an output value in the state of 0 acceleration for constituting the reference of the sensor characteristic (hereinafter, referred to as 0 G output) was measured, a phenomenon where the 0 G output was dispersed at every time of measurement, was caused. The inventors carefully repeated diversified experiments and analyses of results of the experiments with regard to such a phenomenon and reached a conclusion that the phenomenon was caused by electrostatic attraction caused at the inside of the semiconductor acceleration sensor.

That is, it was ascertained as follows. The semiconductor sensor chip was applied with power source voltage for driving it and therefore, it was inevitable that an electrostatic capacitance to some degree was present between the semiconductor sensor chip and the seat. As a result, an electrostatic induction phenomenon where electric charges having different polarities respectively gathered at the surface of the weight portion and the surface of the seat opposing to the weight portion via a predetermined air gap, was caused. An electrostatic attraction was operated between the weight portion and the seat by influence of an electric field caused by the electrostatic induction phenomenon, whereby the dimension of the air gap therebetween was varied from an initial set value and such a variation caused the dispersion in the 0 G output. It was ascertained further that there was a phenomenon where a width of the variation of the 0 G output differed in accordance with the initial set value of the air gap dimension and a potential difference caused between the semiconductor sensor chip and the seat.

Further, the detection range of acceleration is in a very small region of substantially ±1 G through ±2 G and therefore, it is necessary to thinly form the thickness dimension of the beams to improve a detection sensitivity in the structure of the semiconductor sensor chip, however, the detection sensitivity was not necessarily improved only by forming thinly the thickness dimension thereof.

SUMMARY OF THE INVENTION

The present invention has been made in view of the above-described situation and it is a first object of the present invention to provide a semiconductor acceleration sensor capable of obtaining stable output characteristic only by adopting a constitution for controlling a dimension of a gap between a weight portion dislocating in accordance with acceleration and a seat opposed thereto or a constitution for restraining a potential difference caused between the semiconductor sensor chip and the seat, and capable of realizing simplification of structure.

It is a second object of the present invention to provide a semiconductor acceleration sensor capable of preventing as less as possible adverse influence caused by stresses from the side of a substrate thereby achieving downsizing thereof depending on detection level even with a constitution whereby acceleration that is comparatively small to a degree of the acceleration of ±1 G through ±2 G, can accurately be detected.

Further, it is a third object of the present invention to provide a semiconductor acceleration sensor capable of carrying out high accuracy detection operation even in the case where detection range is, for example, substantially ±1 G as a further smaller acceleration range and temperature range for use is wide.

To attain the first object, a semiconductor acceleration sensor according to the present invention includes a semiconductor sensor chip having a weight portion supported via beams, for detecting an acceleration up to substantially ±1 G by utilizing a piezoresistance effect of resistor elements formed on the beams. The semiconductor sensor chip is supported by a seat formed by a material having a thermal expansion coefficient equivalent to a thermal expansion coefficient of the semiconductor sensor chip and the weight portion is arranged at a vicinity of the seat whereby an air damping operation of the weight portion is carried out. A dimension of an air gap between the weight portion and the seat is set to 7 μm or more.

The inventors have ascertained from their experiments that if the dimension of the air gap between the weight portion and the seat is 7 μm or more, an variation of the 0 G output caused by the electrostatic attraction generating between the weight portion and the seat falls within an allowable range.

Therefore, according to the semiconductor acceleration sensor of the present invention, deterioration of the output characteristics thereof caused by the electrostatic attraction generated in the interior of the sensor can be prevented, thereby obtaining stable output characteristics. Further, because the oil for damping use can be omitted, simplification of the structure can be achieved. Moreover, because the thermal expansion coefficient of the semiconductor acceleration sensor chip is equivalent to that of the seat supporting the sensor chip, distortion generating between the semiconductor sensor chip and the seat can be suppressed.

To attain the second object, the semiconductor acceleration sensor of the present invention includes a semiconductor sensor element having a weight portion supported via beams, for detecting an acceleration up to substantially ±1 G through ±2 G by utilizing a piezoresistance effect of resistor elements formed on the beams. A thickness dimension of the beams in the semiconductor sensor element is set to be equal to or more than a dimension when a variation amount of a sensitivity in a temperature range for using the semiconductor sensor element becomes a predetermined allowable value.

The inventors gave attention to the thickness dimension of the beams of the semiconductor acceleration sensor element, to improve detection accuracy of the semiconductor acceleration sensor which detects a very small acceleration in a range of ±1 G through ±2 G. As long as the beams are formed to satisfy the condition of that dimension, detecting operation of high accuracy can be performed. Further, downsizing of the sensor can be also achieved.

To attain the third object, the semiconductor acceleration sensor of the present invention includes a semiconductor sensor element having a weight portion supported via beams, for detecting an acceleration up to substantially ±1 G by utilizing a piezoresistance effect of resistor elements formed on the beams. The semiconductor sensor element is supported by a seat, formed by a material having a thermal expansion coefficient equivalent to a thermal expansion coefficient of the semiconductor sensor element and arranged at a vicinity of the weight portion thereby carrying out an air damping operation. The semiconductor sensor element further comprises an inner frame for supporting the weight portion via the beams and an outer frame fixed to the seat, for supporting the inner frame via a thick connecting portion. A thickness dimension of the beams is set to be equal to or more than a dimension when a variation amount of a sensitivity in a temperature range for using the semiconductor sensor element becomes a predetermined allowable value.

According to this semiconductor acceleration sensor, to detect with high accuracy a further small acceleration in a range up to substantially ±1 G, the thickness dimension of the beams is controlled to fall in a desired range, the a frame portion for supporting the weight portion is composed of a double frames of the inner frame and the outer frame, and moreover, air damping is carried out.

Therefore, when the weight portion is dislocated by a force receiving from acceleration acting on the semiconductor sensor element, the beams supporting the weight portion from the inner frame is distorted, whereby the resistances of the resistor elements are changed and therefore, the acceleration can be detected. At this time, because the inner frame is fixed to the seat in a state of being supported by the outer frame through the thick connecting portion, even if stresses extend from the seat to the frame portion, for example, by variation in an environmental temperature, it can be prevented as much as possible for the stresses to extend to the inner frame. Moreover, because an air damping structure is adopted, an adverse effect caused by temperature variation, which is received through the damping material such as an oil, can be eliminated. Therefore, the semiconductor acceleration sensor can detect with high accuracy a further small acceleration of substantially ±1 G in a wide temperature range for use.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

DETAILED DESCRIPTION OF THE PREFERRED EMBODIMENTS (First Embodiment)

An explanation will be given of the first embodiment in the case where the present invention is applied to a semiconductor acceleration sensor for ABS (Antilock Braking System) of an automobile for detecting an acceleration in a range of substantially ±1.5 G (1 G signifies a gravitational acceleration which is equal to 9.8 m/sec$^2$) in reference to FIG. 1 through FIG. 19.

Figure 1:
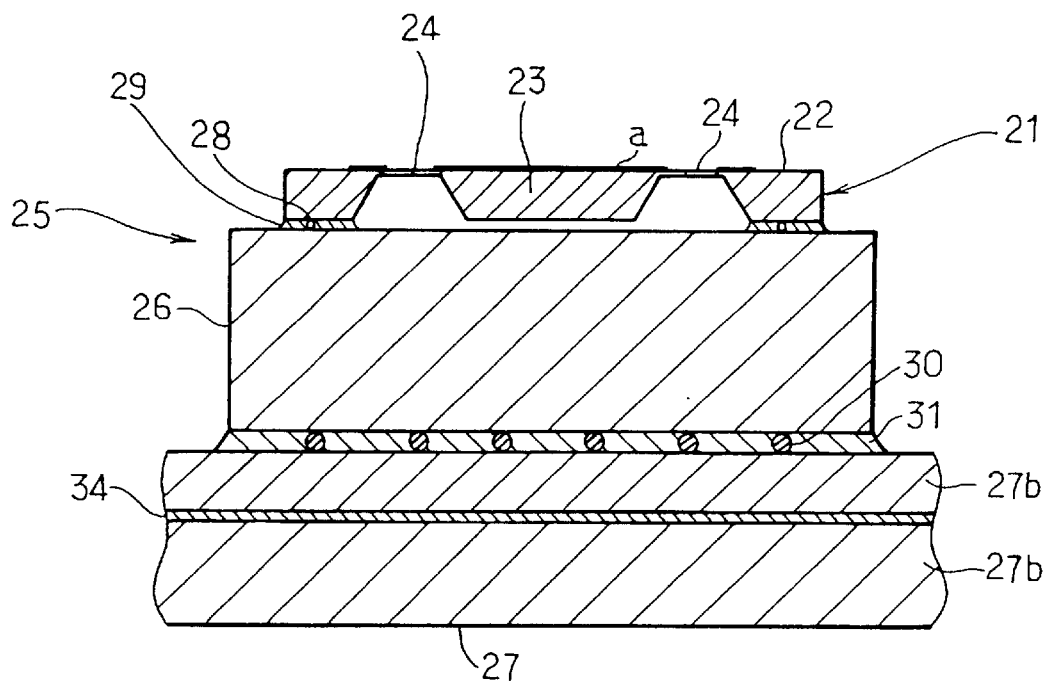
FIG. 1 is a longitudinal sectional view of essential portions according to a first embodiment of the present invention.
Figure 2:
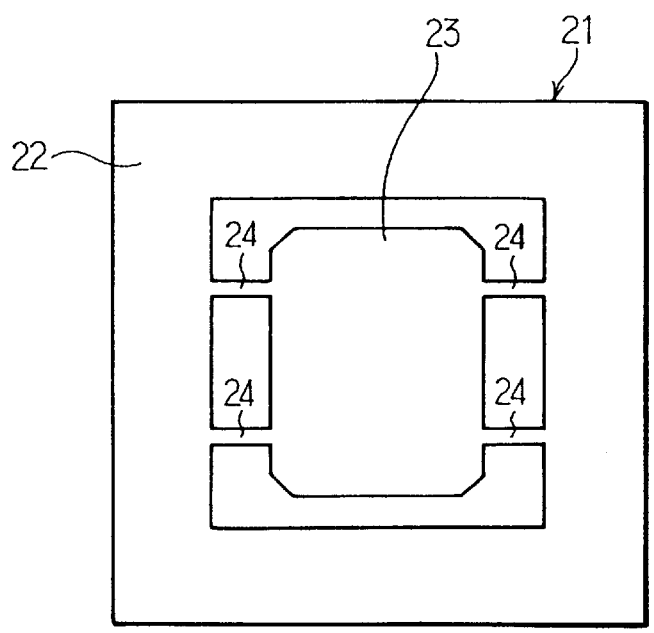
FIG. 2 is a plane view of a semiconductor sensor chip according to the first embodiment of the present invention.

FIG. 1 shows a sectional structure of essential portions of a semiconductor acceleration sensor and FIG. 2 shows a planar shape of a semiconductor sensor chip constituting the core of the semiconductor acceleration sensor, respectively. Further, FIG. 3 schematically shows the constitution of a bridge circuit (strain gage) formed at the semiconductor sensor chip and FIG. 4 shows the bridge circuit.

In FIG. 2, a semiconductor sensor chip 21 is formed by electrochemically etching a material having a large piezoresistance coefficient as in, for example, a silicon single crystal substrate where a weight portion 23 is supported in a both sides supported state at the inner side of a frame 22 having a size of substantially 3×3 mm through 4×4 mm via four beams 24 symmetrically arranged.

The respective beams 24 are formed by utilizing, for example, an epitaxial layer formed on the silicon single crystal substrate. Further, two resistor elements (designated in FIG. 3 and FIG. 4 by attaching symbols R11 through R14 and R21 through R24) are formed at each of the beams 24 by means of a diffusion process or the like and acceleration is detected by utilizing a bridge circuit constituted by the resistor elements.

Figure 3:
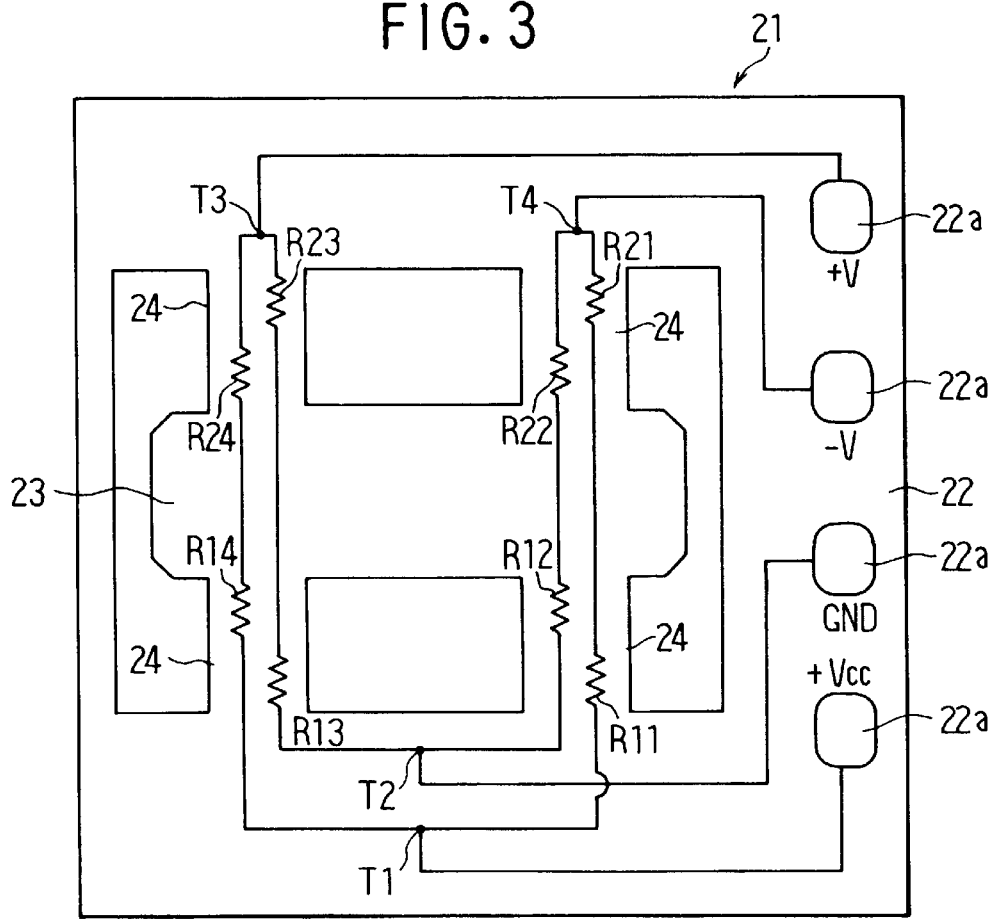
FIG. 3 is a diagram schematically showing the constitution of a bridge circuit formed in the semiconductor sensor chip according to the first embodiment of the present invention.
Figure 4:
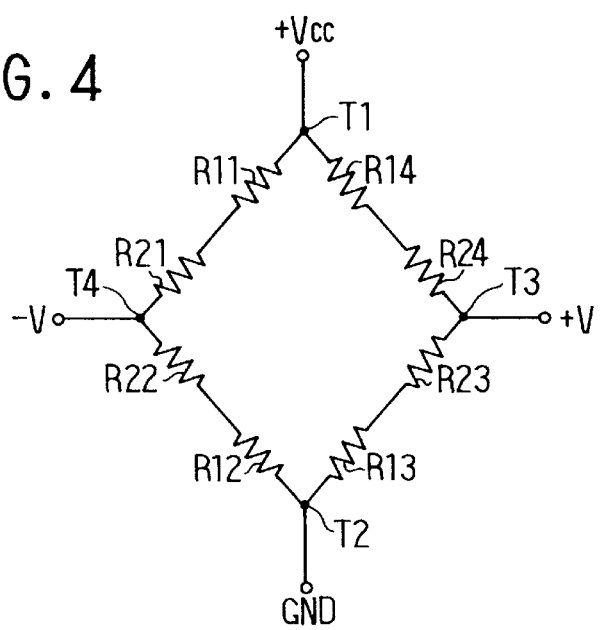
FIG. 4 is a wiring diagram of the bridge circuit according to the first embodiment of the present invention.

Specifically, as shown by FIG. 3, the respective pairs of the resistor elements R11, R12, R13, R14, R21, R22, R23 and R24 formed respectively at the beams 24 are installed in positions having a relationship where ones of them are contracted and the others of them are elongated in accordance with the displacement of the weight portion 23. Further, a bridge circuit with two resistors connected in series (R11 and R21, R13 and R23, R12 and R22, R14 and R24) deforming in the same direction as a side, is formed and a couple of input terminals T1 and T2 and a couple of output terminals T3 and T4 of the bridge circuit, are connected to four bonding pads 22a formed on the frame 22 via a wiring pattern in a thin film shape.

As shown also in FIG. 4, according to the bridge circuit, the resistor elements deforming in the same direction are positioned at sides opposed to each other. Further, the input terminals T1 and T2 are connected respectively to a power source terminal +Vcc and a ground terminal GND and the output terminals T3 and T4 are connected respectively to a positive output terminal +V and a negative output terminal −V. Incidentally, a wiring pattern in a thin film shape is utilized also for forming the bridge circuit and the wiring pattern is shown by attaching a symbol "a" in FIG. 1.

The beams 24 and the weight portion 23 are formed by an anisotropic etching process using an electrochemical etching process, mentioned later, where by carrying out an electrochemical etching process (for example, refer to an electrochemical etching process disclosed in Japanese Patent Application No. Hei 6-42839) by utilizing a difference in conductive types of the silicon substrate and the epitaxial layer, only the silicon substrate is removed by etching and thereafter, the thickness dimension of the epitaxial layer portion is adjusted by a normal etching process whereby the beams 24 having a desired thickness dimension are formed. Incidentally, according to the normal etching process in this case, an anisotropic etching process utilizing an alkali solution of KOH (Potassium hydroxide) or the like is carried out.

In detail, each of the beams 24 is formed so that the thickness dimension thereof is in a range of about 4.2 through 5.5 µm with about 4.5 µm as a median value, a width dimension thereof is in a range of about 140 through 180 µm with 160 µm as a median value and the length dimension thereof is in a range of about 530 through 570 µm with 550 µm as a median value. Further, the weight portion 23 is formed to have a weight of about 1.4 mg.

By setting the respective dimensions as described above, the value of the temperature coefficient TCS (ppm/°C. of the sensitivity in the characteristics as a whole, is set to 800 ppm/°C. or lower as mentioned later, by which the degree of a variation of the sensitivity can be restricted to 5 through 6% or less in a temperature range for use of about −30° C. to 80° C. as the semiconductor acceleration sensor for ABS whereby a very small acceleration in the range of about ±1 G through ±2 G can accurately be detected.

In FIG. 1, the semiconductor acceleration sensor 25 (hereinafter, referred to as G sensor) is constituted by supporting the semiconductor sensor chip 21 by a seat 26 made of silicon via the frame 22. An integrated body of the semiconductor sensor chip 21 and the seat 26 is in a housing (ceramic substrate) 27, mentioned later. Incidentally, the seat 26 is formed by a material having a thermal expansion coefficient equivalent to that of the semiconductor sensor chip 21. Specifically, the material is a silicon substrate which is the same as the sensor chip 21.

In respect of the silicon seat 26 interposed between the semiconductor sensor chip 21 and the ceramic substrate 27, the thickness dimension D is set to about 1.8 mm (equal to or more than 1 mm) and intermediaries therebetween are fixedly adhered by flexible adhesive agents 29 and 31.

According to the flexible adhesive agents 29 and 31, resin beads 28 and 30 as resin particles are mixed with a base adhesive agent. A silicone resin that is a kind of flexible resin is used for the base adhesive agent and the modulus of elasticity of the silicone resin is about 1 MPa.

In respect of the resin beads 28 mixed in the flexible adhesive agent 29 provided between the semiconductor sensor chip 21 and the seat 26, for example, spherical polydivinylbenzene resin of about 8 µm is mixed in the base adhesive agent by 0.1 weight % or lower and the modulus of elasticity of the resin beads 28 is about 4.8 GPa. Further, in respect of the resin beads 30 mixed in the flexible adhesive agent 31 provided between the silicon seat 26 and the ceramic substrate 27, the beads has a particle size of, for example, about 28 µm and are mixed in the base adhesive agent by about 0.54 weight %.

Incidentally, with respect to the lower limit value of the mixture ratio of the resin beads 28, the condition of the lower limit value is that in mounting the semiconductor sensor chip 21, three pieces or more of the resin beads 28 are present to scatter on the lower face (i.e., the adhesive face) of the frame 22 in the semiconductor sensor chip 21 and it is known that about 0.03 wt % is necessary for the lower limit value as an empirical value in consideration of process capability.

According to the adhered state obtained in this way, air damping of the weight portion 23 is carried out by bringing the weight portion 23 of the semiconductor sensor chip 21 and the seat 26 sufficiently close to each other. Specifically, by selecting the diameter of the resin beads 28 to a desired value, the dimension of an air gap between the weight portion 23 and the seat 26 is set in a range of 7 through 15 µm, preferably in a range of 8 through 15 µm.

Incidentally, the resin bead generally has the low modulus of elasticity and the resin bead 28 used in this embodiment preferably has the modulus of elasticity of 10 GPa or lower. For satisfying such a requirement, polydivinylbenzene resin, silicone resin, urethane resin, acrylic resin, polyimide resin, flexible epoxy resin, vinyl resin and the like can be used.

Further, the flexible adhesive agent 29 preferably has the modulus of elasticity of 500 MPa or lower and, for example, silicone resin, urethane resin, acrylic resin, polyamide resin, polyimide resin, flexible epoxy resin and the like can be used.

Figure 5:
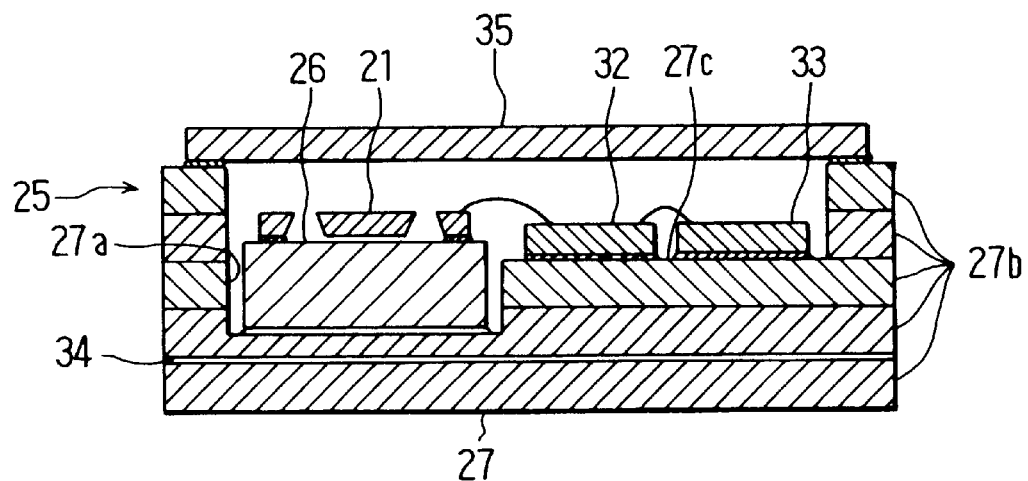
FIG. 5 is a longitudinal sectional view of an overall of the first embodiment of the present invention.
Figure 6:
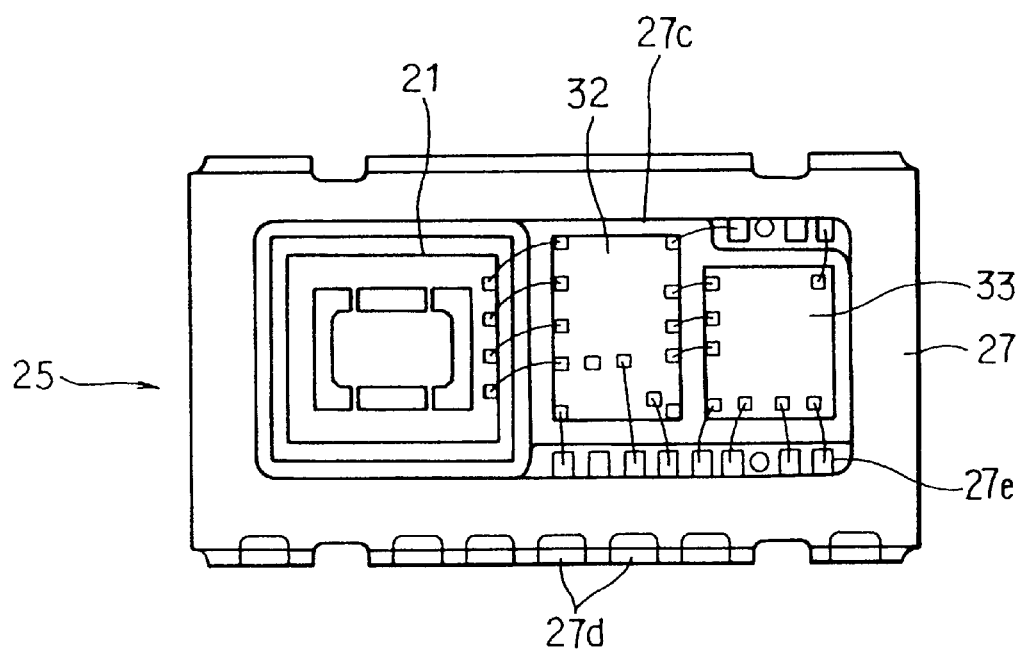
FIG. 6 is a plane view of the overall of the first embodiment of the present invention in a state where a lid is removed.

As shown by FIG. 5 and FIG. 6, the seat 26 is fixed onto a ceramic substrate 27b constituting the housing 27 by adhesion in a state where it is housed in a recess 27a formed in the housing 27. In such adhesion, the flexible adhesive agent 31 mixed with a plurality of pieces of the resin beads 30, is used (refer to FIG. 1) and also in this case, the resin beads 30 having the modulus of elasticity of 10 GPa or lower is preferably utilized as described above and the flexible adhesive agent 31 having the modulus of elasticity of 500 MPa or lower is preferably used.

The housing 27 is constituted by laminating a plurality of sheets of: the ceramic substrates 27b and is formed in a box-like shape having the recess 27a and the base portion 27c contiguous to the recess 27a at the inside thereof. An amplifying circuit 32 having functions for providing power source voltage to the semiconductor sensor chip 21 and amplifying an output detected by the sensor chip 21, and an adjusting circuit 33 for carrying out level adjustment of power source voltage applied on the amplifying circuit 32, are bonded onto the base portion 27c by die bonding.

A plurality of wiring patterns for power source supply or for outputting a detected output are formed on the ceramic substrates 27b constituting the housing 27 by utilizing conductive pastes, not shown, formed to print between the respective substrates 27b and through holes, not shown, penetrating the respective substrates 27b.

In this case, as shown by FIG. 6, the upper edge of the housing 27 is provided with a group of external terminals 27d connected to these wiring patterns and the base 27c is provided with a group of internal terminals 27e similarly connected to the wiring patterns. Incidentally, connection between the semiconductor sensor chip 21 and the amplifying circuit 32, and intermediaries among the amplifying circuit 32, the adjusting circuit 33 and the group of internal terminals 27e, are connected by wire bonding.

Especially, as shown by FIG. 1 and FIG. 5, an electrostatic shield 34 in a thin film shape forming from a conductive material of an aluminum paste, a copper paste or a tungsten paste, is formed over entire portions between the ceramic substrate 27b facing the recess 27a in the housing 27 and the ceramic substrate 27b disposed therebelow. Incidentally, although not specifically illustrated, the electrostatic shield 34 is connected to a ground line by utilizing a through hole or the like formed in the ceramic substrate 27b.

Further, a lid 35 (refer to FIG. 5) made of, for example, a ceramic substrate is arranged by adhesion on the housing 27 to seal the inside in air tight by which the G sensor 25 is completed. Further, actually, stabilization of output characteristic is achieved by subjecting at least the semiconductor sensor chip 21 and the seat 26 supporting the semiconductor sensor chip 21 to a burn-in processing. According to the Embodiment, the burn-in processing is carried out, for example, by exposing the semiconductor sensor chip 21 in a atmosphere of a predetermined temperature (about 120° C.) for a predetermined period of time (about 6 hours) or more under a state where it is applied with a predetermined voltage (about 5 through 6 volt).

By adopting the above-described constitution, the semiconductor sensor chip 21 is fixedly adhered onto the silicon seat 26 by which the weight portion 23 is separated from the silicon seat 26 by a thickness dimension (for example, about 8 μm through 15 μm) of the flexible adhesive agent 29. By providing the air gap of this degree, an air damper can be constituted by using air as damper when the weight portion 23 is applied with an excessive acceleration. The semiconductor acceleration sensors constituted as described above, are mounted at positions orthogonal to each other in a state where they are erected on a mounting substrate in order to detect accelerations in two-dimensional directions on the horizontal plane.

According to the above-described constitution, in receiving an acceleration in the horizontal direction, the two semiconductor acceleration sensors receive acceleration having components in correspondence with the respective directions of the two sensors. According to the semiconductor acceleration sensor, the weight portion 23 of the semiconductor sensor chip 21 receives a force in accordance with the applied acceleration in a direction opposed to the applied acceleration direction. When the weight portion 23 is dislocated in the direction of receiving the force thereby, the four beams 24 supporting the weight portion 23 are distorted.

At this moment, for example, when the weight portion 23 is dislocated to the side of the seat 26, the respective beams 24 receive compressive stresses at positions of the surfaces thereof on the side of the weight portion 23 and receive tensile stresses at positions thereof on the side of the frame 22 whereby the resistances of the respectively formed diffused resistors are changed by the piezoresistance effect. Then, the voltage output is provided in accordance with the change in the resistances of the respective resistors connected in a bridge connection.

Further, when an excessive acceleration is received, a narrow clearance between the weight portion 23 and the seat 26 has the effect of an air damper and therefore, the weight portion 23 and the respective beams 24 can be prevented from destructing.

Further, the thickness dimension of the seat 26 is set to 1.75 mm that is more than 1 mm and the seat 26 is fixedly adhered by using the flexible adhesive agents 29 and 31 and therefore, even if there is a temperature variation, the influence of stress can be minimized such that variation in sensitivity at that time is brought into a predetermined allowable range by which even in the case where an acceleration of about ±1.5 G is measured, the acceleration can be detected with small error and high accuracy.

Next, data forming the basis for adopting the above-described constitution will be shown. That is, the above-described respective dimensions are based on results of measuring a sensitivity variation ΔS (%) from sensitivities S(V/G) before and after a temperature cycle test with respect to the thickness dimension of the seat 26 and measuring a sensitivity variation ΔS (%) from the mixture ratio of resin beads 28 and 30 of the flexible adhesive agents 29 and 31 and sensitivities S(V/G) before and after a low temperature leave test.

Note that, the sensitivity S is defined by a value of an output voltage per G. Actually, the sensitivity is defined by the following equation (1) as a voltage value (V) of a difference between an output voltage V0(V) when the acceleration is 0 G and an output voltage V1(V) when the acceleration is 1 G since the measurement range of the semiconductor acceleration sensor per se is actually ±1.5 G.

$$S(V/G)=V1-V0 \qquad (1)$$

Further, the sensitivity variation ΔS(%) is defined by the following equation (2) as a ratio of a difference between a sensitivity $S_0$ before test and a sensitivity S1 after test in respect of $S_0$.

$$\Delta S(\%)=(S_0-S1)/S_0\times 100(\%) \qquad (2)$$

Now, firstly, with respect to the thickness dimension of the seat 26, a temperature cycle test that is a temperature stress test was carried out by using various samples ranging from a sample where the seat 26 was not provided, that is, when the thickness dimension was null to a sample having the thickness dimension of about 2 mm. According to the temperature cycle test, a single cycle test was set from when a sample was left in an atmosphere of −30° C. for 2 hours and sequentially left in an atmosphere of 85° C. for 2 hours after the sensitivity $S_0$ had been measured under a room temperature state to when the sensitivity S1 was measured by recovering the temperature of the sample to the room temperature.

Figure 7:
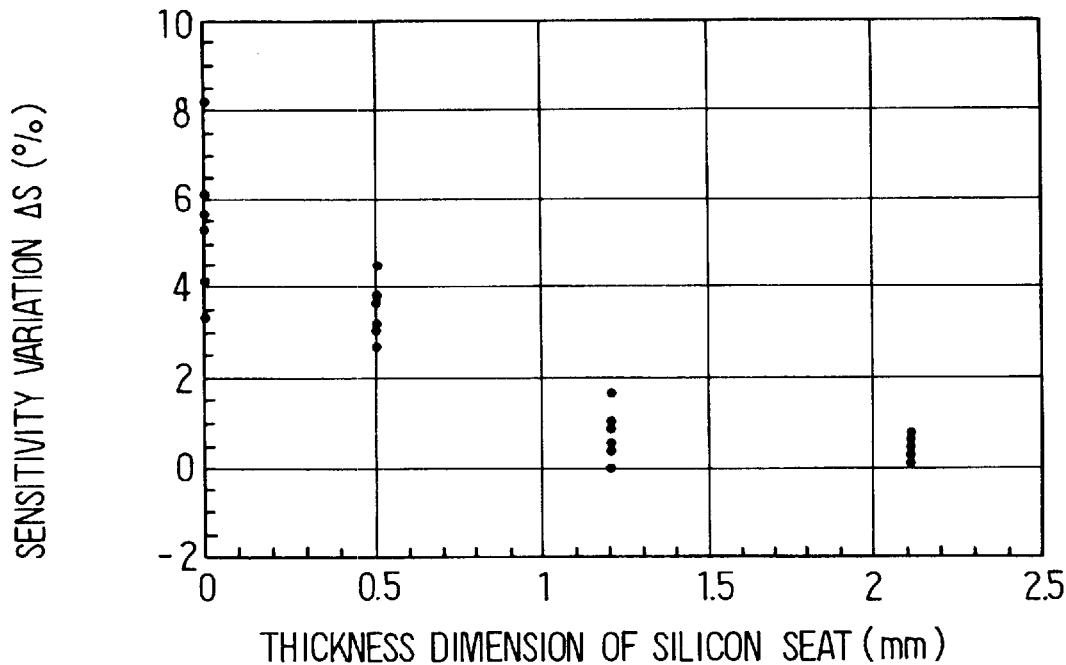
FIG. 7 is a graph of measurement result showing a relationship between a thickness dimension of a silicon seat and sensitivity variation according to the first embodiment of the present invention.

In FIG. 7, the sensitivity variation ΔS before and after the temperature cycle test is plotted in respect of the thickness dimension of the seat 26. According to the result, in order to fall the sensitivity variation ΔS in a range of about ±2% as a reference for accurately detecting the acceleration in a detection region of low acceleration of about ±1 G (a range of about ±1 G through ±2 G), it is found that the thickness of the seat 26 is preferably set to 1 mm or more.

Next, with respect to the mixture ratio of the resin beads 28 and 30 for mixing to the flexible adhesive agents 29 and 31, a low temperature leave test that is a temperature stress test was carried out by using various samples ranging from a sample where the resin beads 28 and 30 were not mixed to a sample where they were mixed by about 0.55 wt %. The low temperature leave test was set as a single cycle test from when a sample was left in an atmosphere of −40° C. for a predetermined period of time after the sensitivity $S_0$ had been measured under a room temperature state to when the sensitivity S1 was measured after recovering the temperature to the room temperature.

Figure 8:
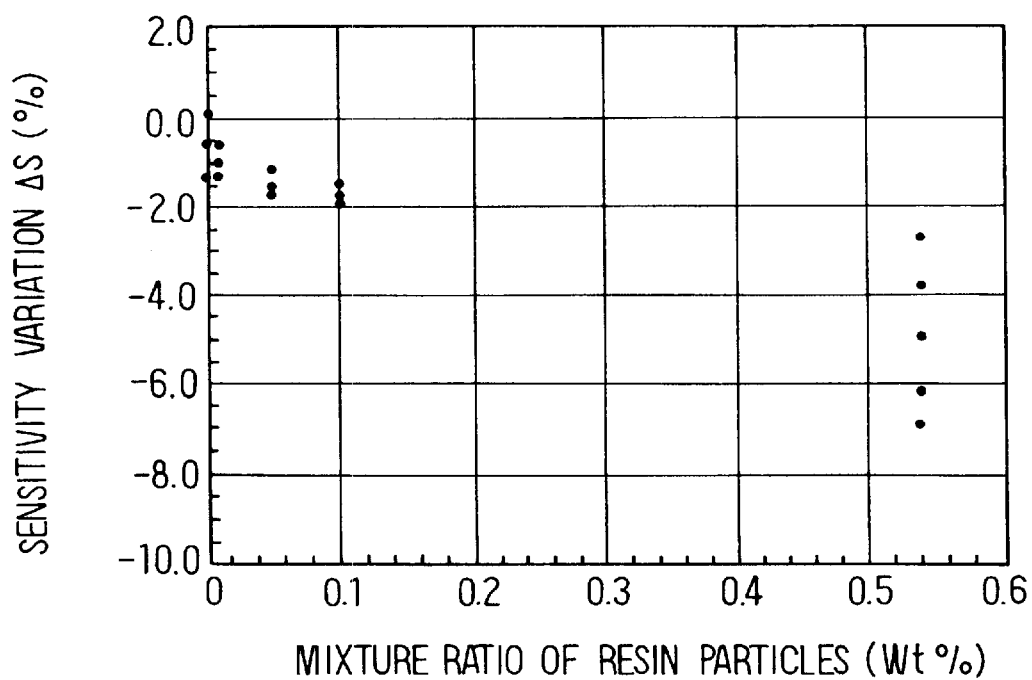
FIG. 8 is a graph of measurement result showing a relationship between a mixture ratio of resin particles and sensitivity variation according to the first embodiment of the present invention.

FIG. 8 shows a result of measurement with respect to the sensitivity variation ΔS before and after the low temperature leave test when the mixture ratio of the resin beads 28 and 30 to the flexible adhesive agent 29 and 31 was changed. It was found from the result that in the case where the sensitivity variation ΔS is set to the above-described reference, that is, about ±2%, it was necessary that the mixture ratio of the resin beads 28 and 30 was about 0.1 wt % or lower. Incidentally, as mentioned above, the lower limit value of the mixture ratio is theoretically preferably set to a value where at least three pieces of the resin beads 28 and 30 are arranged at pertinent intervals in the adhering face for adhering to the sensor chip 21, however, it is known that the lower limit value is about 0.03 wt % as an empirical value substantially from a relationship with respect to the process capability.

According to the embodiment, the thickness dimension of the seat 26 was set to about 1.75 mm, that is a value of 1 mm or more and, and the mixture ratio of the resin beads 28 and 30 of the flexible adhesive agents 29 and 31 is set to about 0.1 wt % or lower thereby carrying out the adhering and fixing operation and therefore, the sensitivity variation ΔS can be restricted to about 2% or lower even after subjecting a sample to a temperature cycle test or a low temperature leave test as a temperature stress test by which even if the sensor is used under an environment having the temperature change, the acceleration in a low range of about ±1.5 G can accurately be detected.

Next, the thickness dimension of the respective beams 24 of the semiconductor sensor chip 21 is set in a range of 4.2 μm through 5.5 μm, preferably, at 4.5 μm based on the following new recognition by the inventors.

Based on a discovery where the thickness dimension of the respective beams 24 influences a temperature variation of sensitivity TCS in correspondence with temperature variation of an environment of using the semiconductor sensor chip 21, the inventors prepared samples having various sizes of the thickness dimensions and measured the temperature coefficient (variation) of the sensitivity TCS (ppm/°C.) with respect to the respective samples.

Figure 9:
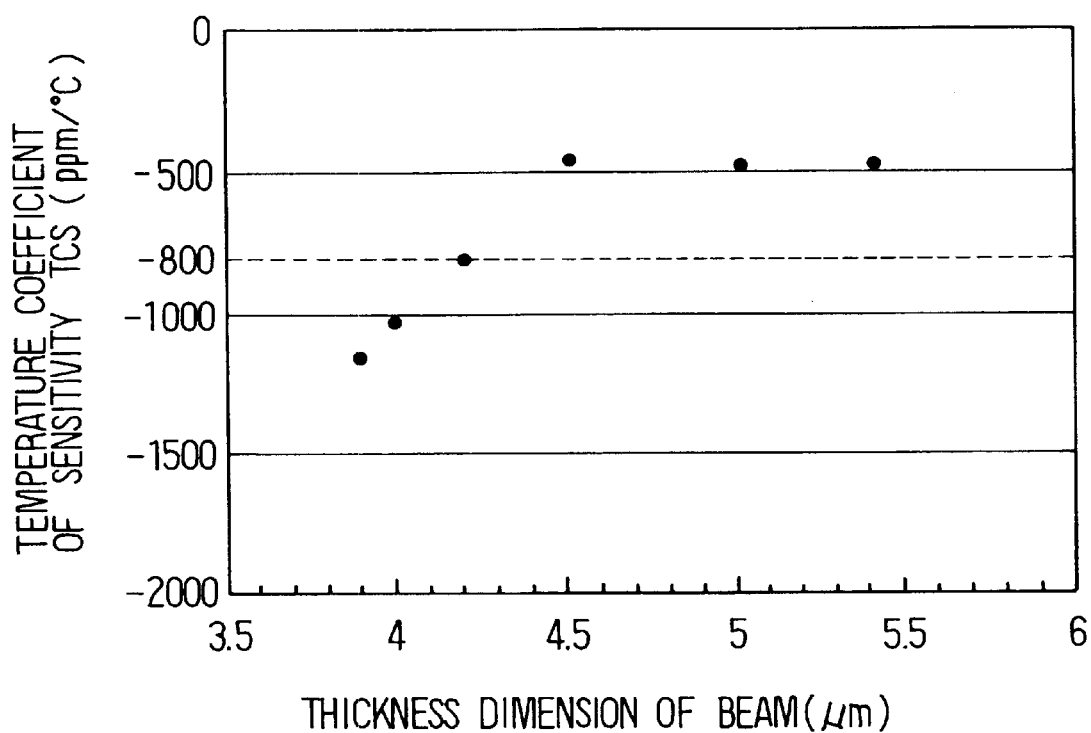
FIG. 9 is a graph of measurement result showing a relationship between a thickness dimension of a beam of the sensor chip and a temperature coefficient of sensitivity according to the first embodiment of the present invention.

As a result, as shown by FIG. 9, it was found that the temperature variation of sensitivity TCS is within ±800 ppm/°C. when the thickness dimension of the respective beams 24 is set to a value of 4.2 μm or more. Further, in a practical point of view, as an upper limit value, the thickness has an upper limit of about 5.5 μm when the acceleration of about ±1 G through ±2 G was detected since the thicker the thickness dimension of the respective beams 24, the lower the detection sensitivity per se.

In the above-described case, the temperature coefficient of the sensitivity TCS (ppm/°C.) is defined as follows. First, the sensitivity S indicating the output characteristic of the acceleration sensor is defined as in the Equation (1).

Further, the temperature coefficient of the sensitivity TCS (ppm/°C.) is defined as a value indicating a degree of sensitivity variation in respect of temperature change of 1° C. when the temperature of the environment using a sensor is changed and is calculated as in the following equation (3) from sensitivities SRT and SHT at respective temperatures when a temperature of a high temperature side HT is assumed as an upper. limit value with respect to a reference temperature RT (for example, room temperature or the like) in the used temperature range as a median.

$$TCS=[(SHT-SRT)/SRT]/(HT-RT)\times 10^6 \quad (3)$$

The temperature coefficient of sensitivity TCS shown by Equation (3) indicates an amount of variation of sensitivity per °C. and accordingly, as shown by the following equation (4), the variation degree of sensitivity ΔS in the used temperature range, can be provided as a value of TCS multiplied by an amount of variation of temperature ΔT from the room temperature RT that is the reference temperature. Then, by modifying Equation (4), the necessary temperature coefficient of sensitivity TCS can be calculated conversely from the variation degree of sensitivity ΔS that is allowable in the temperature range for use and the amount of variation of temperature ΔT as shown by the following equation (5).

$$\Delta S=\Delta T\times TCS \quad (4)$$

$$TCS=\Delta S/\Delta T \quad (5)$$

Now, when a range of, for example, about −30° C. to 80° C. is assumed as the used temperature range according to the embodiment, if the reference temperature of an environment where the sensor is used is set to 25° C. as room temperature RT, the degree of variation of temperature ΔT becomes ±55° C. and the value of the variation degree of sensitivity ΔS in that case can be calculated as about 4.4% from Equation (4). When the value of the degree of variation of sensitivity ΔS is about 5 through 6% or lower, in the semiconductor acceleration sensor used for the ABS, a very small acceleration of about ±1 G through ±2 G can accurately be detected, which satisfies this condition.

Next, an explanation will be given of an electrochemical etching processing that is carried out in forming the weight portion 23 and the respective beams 24 of the semiconductor sensor chip 21 and an etching method for controlling the thickness dimension of the respective beams 24 in reference to FIG. 10 through FIG. 14. That is, diffused resistors utilizing the piezoresistance effect are formed at portions of an epitaxial layer 21b laminated on a silicon substrate 21a corresponding to the respective beams 24 by being subjected to a diffusing process or the like. Thereafter, the respective diffused resistors are formed in a state of being connected in a bridge by performing aluminum wiring and further, electrode portions which can be extended outwardly are formed.

Figure 10:
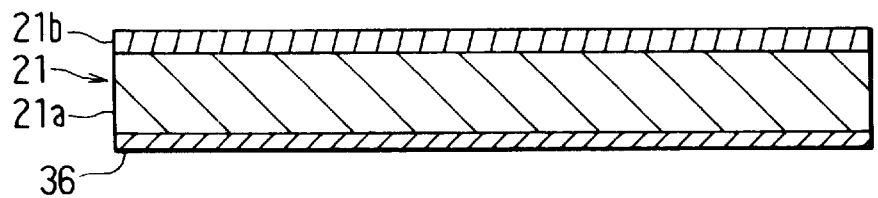
FIGS. 10 through 14 are explanatory views showing etching processing steps of the sensor chip according to the first embodiment of the present invention.
Figure 11:
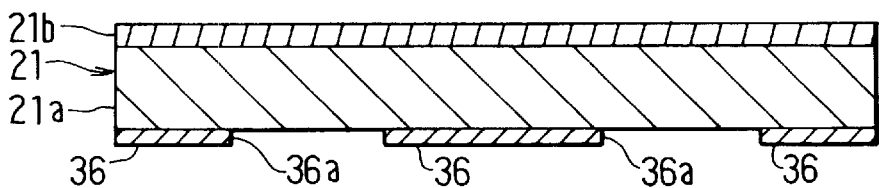
Figure 12:
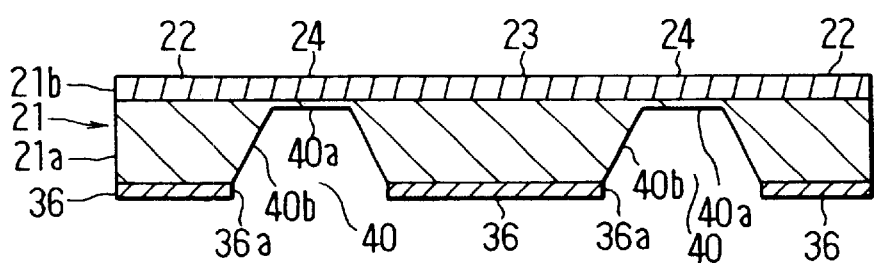

When the respective built-in elements of the diffused resistors and the like are formed as described above, hereinafter, a silicon nitride film 36 as a mask material in etching is formed by a process of CVD (Chemical Vapor Deposition) or the like on the surface of the semiconductor sensor chip 21 on the side of the silicon substrate 21a (refer to FIG. 10). Successively, openings 36a are formed corresponding to etching regions by patterning the silicon nitride film 36 by photolithography or the like (refer to FIG. 11).

Next, the epitaxial layer 21b of the silicon substrate 21a is protected by bringing it into a state where it is covered with a resin wax or the like and an electrochemical etching processing is performed by using an alkaline anisotropic etching solution. In the etching processing, a KOH (potassium hydroxide;) solution is used as an alkaline anisotropic etching solution, the silicon substrate 21a is dipped in a vessel filled with the KOH solution and the etching processing is carried out in a state where voltage is applied such that the silicon substrate 21a of p type is made negative and the epitaxial layer 21b of n type is made positive. The etching processing is carried out by utilizing, for example, an electrochemical stop etching process disclosed in Japanese Patent Application No. Hei. 6-42839, as mentioned above.

Thereafter, when the electrochemical stop etching using the alkaline anisotropic etching solution is finished, an etching region 40 is formed at a portion where the silicon nitride film 36 is exfoliated on the side of the silicon substrate 21a of p type. A bottom portion 40a of the etching region 40 is etched to a degree of reaching a vicinity of a pn junction face of the silicon substrate 21a and the epitaxial layer 21b and a side face portion 40b of the etching region 40 exposes the (111) face having a retarded etching rate whereby the side face portion 40b becomes an inclined face (refer to FIG. 12).

Next, the thickness dimension of the beams 24 formed by the etching processing is measured as follows. That is, after cleaning the silicon substrate 21a taken out from the etching solution, the thickness dimension of the respective beams 24 is measured in a non contact state by using, for example, FT-IR (Fourier Transformation Infrared Spectrometer), a laser measuring instrument or the like.

Thereafter, an additional etching processing is carried out to constitute a predetermined thickness dimension for each sheet in a wafer state based on the result of measurement. According to the additional etching processing, the amount of etching the epitaxial layer 21b is controlled such that the predetermined thickness dimension is provided while controlling the etching amount by a time period by using an etching solution of which etching rate is accurately known. As an etching solution in this case, a KOH solution which is an alkaline anisotropic etching solution and hydrogen fluoride HF that is an isotropic etching solution are used.

Figure 13:
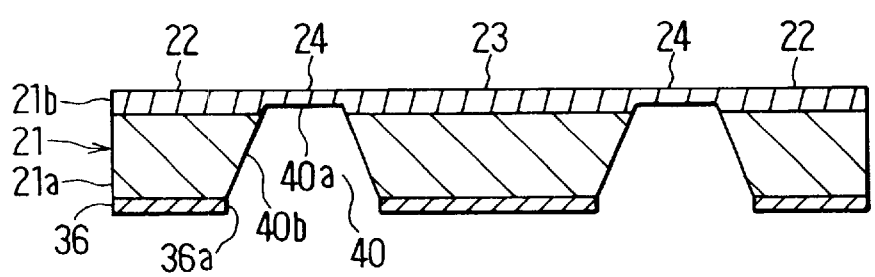

As an etching amount, the epitaxial layer 21b is etched up to about 5 through 6 μm by using an alkaline anisotropic etching solution and as a finishing step, the epitaxial layer 21b is etched up to 4.5 μm by using an isotropic etching solution such as hydrogen fluoride HF (refer to FIG. 13).

Figure 14:
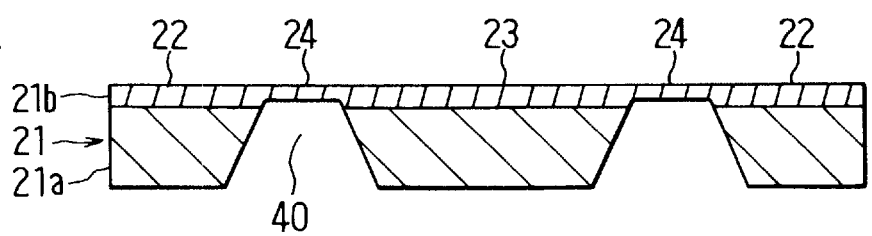

In this way,. when the etching is performed until the epitaxial layer is thinned up to about 4.5 μm that is the above-described thickness dimension while measuring the thickness dimension of the respective beams 24, etching operation is finished and thereafter, the operation is finished by exfoliating the silicon nitride film 36 remaining on the surface of the silicon substrate 21a (refer to FIG. 14).

Incidentally, according to the above-described etching processing, the thickness dimension of the epitaxial layer 21b is set thickly to some degree and after etching the silicon substrate 21a to expose the epitaxial layer 21b by the electrochemical stop etching processing, the thickness dimension of the respective beams 24 is controlled by the time control and accordingly, even if dispersion in the thickness dimension of the epitaxial layer 21b is not considered, the thickness dimension of the beams 24 can accurately be controlled and further, by using the isotropic etching solution, the strength of the respective beams 24 can also be promoted.

The above-described etching processing constitutes a drawback in view of the fact that the steps are complicated. By contrast, in place of the above-described method, by making the thickness dimension per se of the epitaxial layer 21b substantially equal to the final thickness dimension of the respective beams 24, the thickness dimension can be obtained with a predetermined accuracy only by carrying out the electrochemical stop etching processing whereby the fabrication steps are simplified. In this case, the accuracy of the thickness dimension of the beams and the strength of the beams are deteriorated compared with those in the above-described method.

According to the embodiment, in the constitution for detecting a very small acceleration of substantially ±1 G through ±2 G, in order to limit the variation degree of sensitivity in the temperature range for use to a predetermined level or lower, attention is paid to controlling the thickness dimension of the beams 24 of the semiconductor sensor chip 21. It is found that the thickness dimension of the beams 24 is set to a range of 4.2 μm or more and smaller than 5.5 μm, preferably 4.5 μm such that the temperature coefficient of sensitivity TCS is ;set to 800 ppm/°C. in order to set the variation degree of sensitivity ΔS to 5 through 6% in the temperature range for use of −30° C. to 80 ° C., by which the detecting operation can be carried out accurately while downsizing the sensor.

Further, according to the above-described constitution of the embodiment, the following operation and effect can be achieved.

That is, according to the embodiment, the vibration of the weight portion 23 is attenuated by the air damping between the weight portion 23 and the seat 26 by setting the dimension of the air gap between the weight portion 23 of the semiconductor sensor chip 21 and the seat 26 supporting the sensor chip 21 to a range of 7 through 1 μm. In such a constitution, it is i apparent that the magnitude of the dimension of the air gap is deeply relevant to a vibration attenuating amount by the air damping.

Hence, the applicants of the present application found by experiment a relationship between the vibration of the weight portion 23 and the dimension of the air gap between the weight portion 23 and the seat 26, with respect to the G sensor 25 constituted as described above, that is, the G sensor having the semiconductor sensor chip 21 capable of detecting the acceleration of substantially ±1 G by utilizing the piezoresistance effect of the resistor elements formed on the beams 24. According to the experiment, the vibration attenuating amount (air damping characteristic) of the G sensor 25 was investigated under a state where the weight portion 23 was applied with vibration and data of experiment is shown by FIG. 17.

Figure 17:
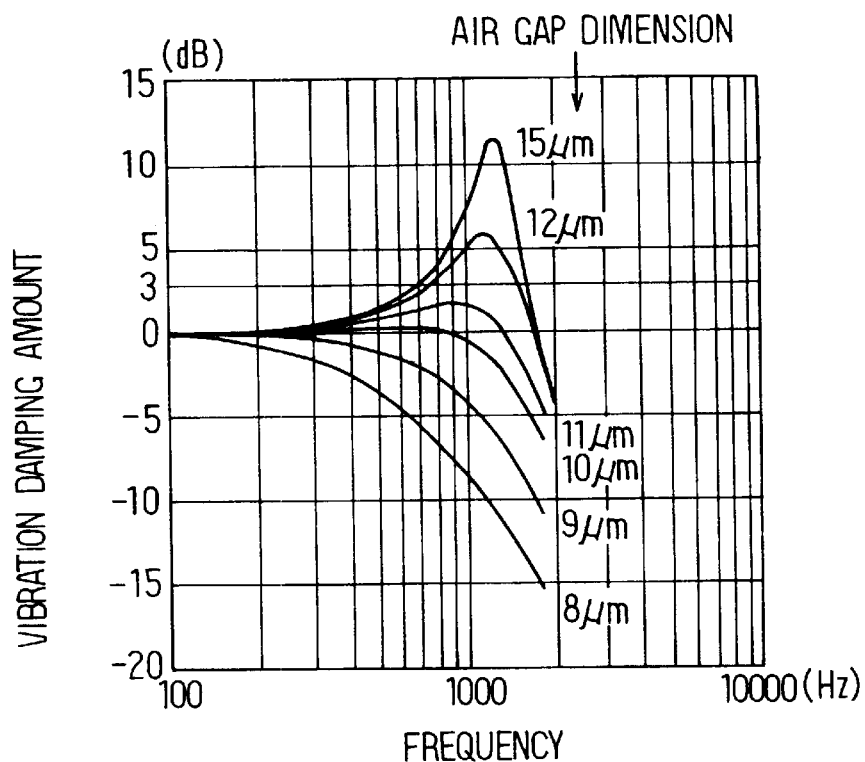
FIG. 17 is a graph showing air damping characteristics with the air gap dimension as a parameter according to the first embodiment of the present invention.

As is apparent from FIG. 17, when the dimension of the air gap between the weight portion 23 and the seat 26 is equal to or lower than about 15 μm, a sufficient air damping effect can be provided in a general specification and as a result, deterioration of output characteristic of the G sensor 25 caused by the vibration of the weight portion 23 can be prevented. Incidentally, in order to satisfy a severer requirement, for example, a requirement for the vibration attenuating amount of 3 dB or lower, the dimension of the air gap is set to about 11.5 μm or lower.

Further, according to the embodiment, the lower limit value of dimension of the air gap between the weight portion 23 and the seat 26 is set to 7 μm by the following reason.

That is, as a result of a detailed investigation by the inventors of the application concerning a phenomenon in which an output value under a state where the acceleration was null which constituted the reference of the sensor characteristic in the G sensor 25 (hereinafter, referred to as 0 G output) was varied, it was found that the level of the 0 G output was always varied in a constant direction and further, the direction of variation was in a direction of attracting the weight portion 23 to the side of the seat 26 and a conclusion that the variation was caused by an electrostatic attraction caused at the inside of the G sensor 25, was obtained.

Figure 15:
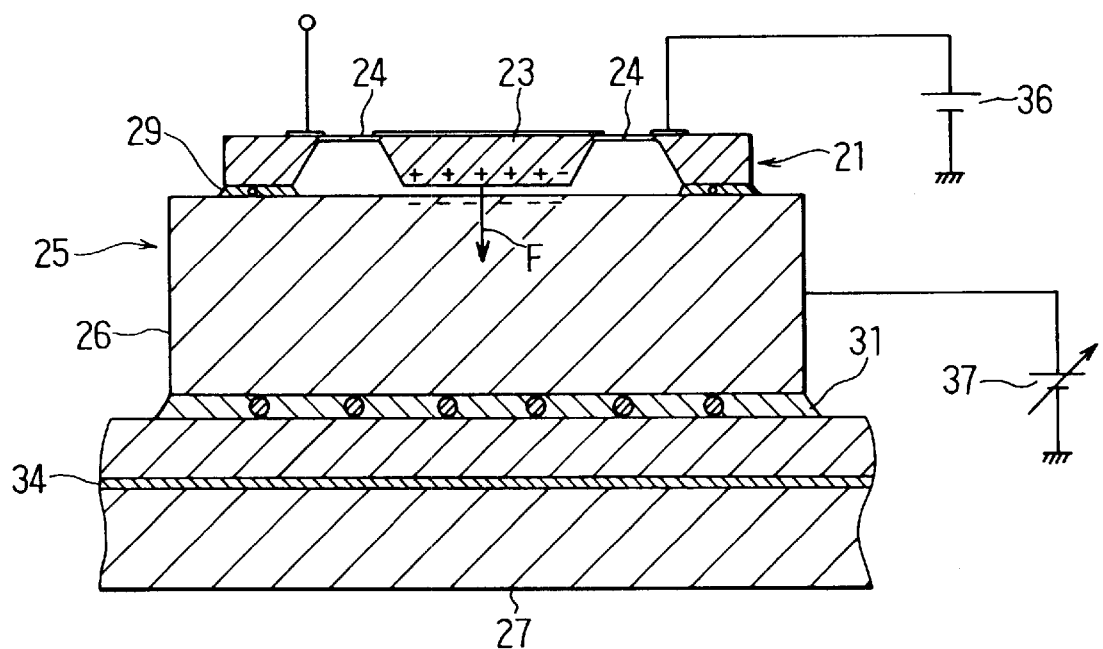
FIG. 15 is longitudinal sectional view of essential portions for explaining the operation of the first embodiment of the present invention.

An explanation will be given of such a phenomenon in reference to FIG. 15 showing a sectional structure of essential portions of the G sensor 25. The semiconductor sensor chip 21 is under a state where it is applied with power source voltage for driving it and the semiconductor sensor chip 21 is adhered to the seat 26 by the flexible adhesive agent 29 having insulating performance and therefore, it is inevitable that an electrostatic capacitance to some degree is present therebetween.

Hence, as shown by FIG. 15, an electrostatic induction phenomenon where, for example, positive electric charge (+) gathers on a surface of the weight portion 23 opposed to the seat 26 and negative electric charge (−) of reverse polarity gathers on the side of the seat 26, is caused and owing to an influence of an electric field caused thereby, an electrostatic attraction F represented by the following equation (6) is caused between the weight portion 23 and the seat 26.

$$F = 1/2 \times \in \times S \times (V/d)^2 \qquad (6)$$

where $\in$ is relative dielectric constant of air, S is a bottom area of the weight portion 23, V is a potential difference between the weight portion 23 and the seat 26 and d is a dimension of the air gap.

When such an electrostatic attraction F is generated, the weight portion 23 is attracted to the side of the seat 26, which causes the dispersion in the 0 G output. Accordingly, it is found from the above equation (6) that the width of variation in the 0 G output differs in accordance with an initial set value of the dimension of the air gap between the weight portion 23 and the seat 26.

Figure 16:
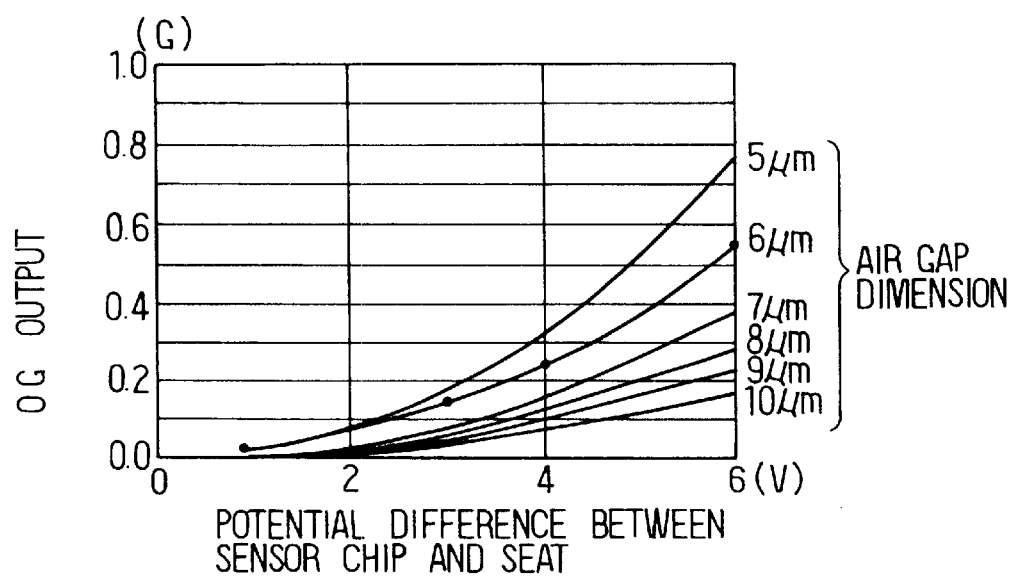
FIG. 16 is a graph showing relationships between a potential difference between the sensor chip and a seat and the 0 G output with an air gap dimension as a parameter according to the first embodiment 1 of the present invention.

The inventors of the application confirmed the influence of the dimension of the air gap on the 0 G output by calculation and experiment. FIG. 16 shows a result of calculating a relationship between the potential difference between the semiconductor sensor chip 21 and the seat 26, and the amount of variation in the 0 G output when the dimension of the air gap is changed from 5 μm to 10 μm with an increment of 1 μm and the result of calculation is shown by curves of solid lines. Further, FIG. 16 shows values actually measuring the relationship between the potential difference and the 0 G output when the dimension of the air gap is 6 μm by black circles. Incidentally, as shown by FIG. 15, the measurement was carried out by applying a plurality of stages of levels in the potential difference between the semiconductor sensor chip 21 and the seat 26 by utilizing a constant voltage power source 36 and a variable voltage power source 37.

As is apparent from FIG. 16, the result of calculation and the measured values almost coincide with each other. After all, in order to reduce the above-described electrostatic attraction F thereby confining the variation in the 0 G output in an allowable range, it is necessary to enlarge the dimension of the air gap between the weight portion 23 and the seat 26 to some degree. According to the embodiment, based on the characteristic shown by FIG. 16 and a situation where the potential difference in design that is applied between the semiconductor sensor chip 21 and the seat 26 is about 3.5 V, the dimension of the air gap is set to 7 μm or more, preferably 8 μm or more (10 μm or more when a particularly severe requirement is required).

After all, as the result of setting the dimension of the air gap as mentioned above, deterioration in the output characteristic caused by the vibration of the weight portion 23 can be prevented and further, deterioration in the output characteristic caused by the electrostatic attraction generated at the inside can simultaneously be prevented by which the stable output characteristic can be achieved.

In this case, the control of the dimension of the air gap between the weight portion 23 and the seat 26 is carried out by the plurality of resin beads 28 interposed between the seat 26 and the frame. 22 of the semiconductor sensor chip 21 and accordingly, the control of the dimension of the air gap can be performed severely and easily which can contribute to stabilization of the output characteristic.

Further, according to the embodiment where the vibration of the weight portion 23 is attenuated by the air damping, oil for damping as in the conventional constitution is dispensed with and therefore, simplification of structure can be realized. Furthermore, the thermal expansion coefficients of the semiconductor sensor chip 21 and the seat 26 supporting the semiconductor sensor chip 21 are equivalent to each other and therefore, a distortion caused by thermal stresses generated between the semiconductor sensor chip 21 and the seat 26 can be restrained and a frame having a double structure as in the conventional semiconductor sensor chip is not necessary whereby downsizing of an overall structure thereof can be realized.

The seat 26 and the frame 22 of the semiconductor sensor chip 21 supported by the seat 26 are adhered to each other by the flexible adhesive agent 29 having the low modulus of elasticity (500 MPa or lower) and accordingly, stresses operating from the side of the seat 26 to the side of the semiconductor sensor chip 21 can be alleviated by which further stabilization of the output characteristic can be achieved. In this case, although the resin beads 28 functioning as spacers are mixed in the flexible adhesive agent 29, ones having a comparative low modulus of elasticity (10 GPa or lower) are used for the resin beads 28 and therefore, there is no concern of hampering the stress alleviating function of the flexible adhesive agent 19 by the presence of the resin beads 28.

Meanwhile, when static electricity from outside is acted on the semiconductor sensor chip 21, the large electrostatic attraction may be caused between the weight portion 23 and the seat 26 whereby an extreme variation in the 0 G output may be caused. In this regard, according to the embodiment, the electrostatic shield 34 for removing the influence of static electricity from outside with respect to the semiconductor sensor chip 21 is provided at an entire region of the bottom face of the housing 27 and therefore, a situation where the influence by static electricity from outside is effected on the semiconductor sensor chip 21 can effectively be prevented which contributes to stabilization of the 0 G output.

Figure 18:
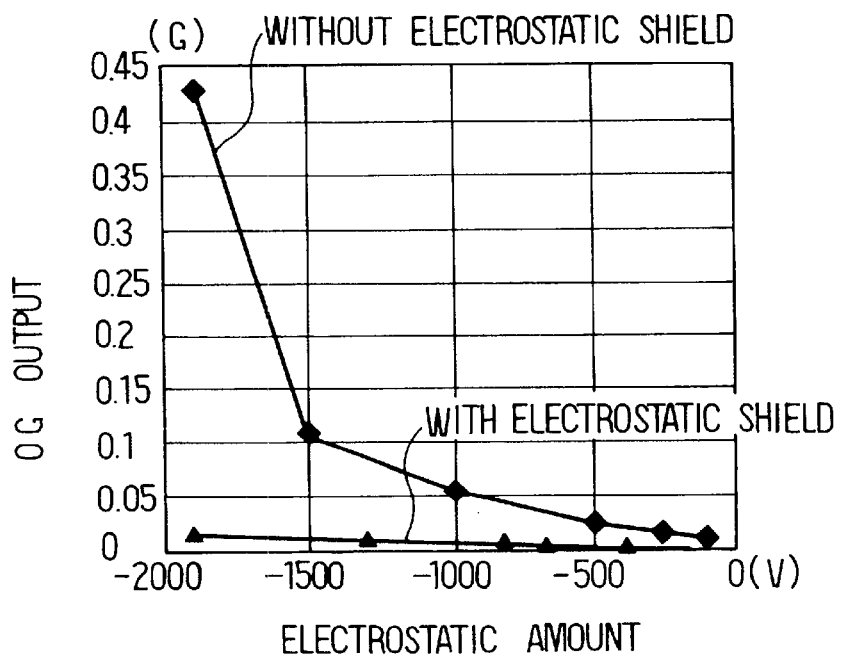
FIG. 18 is a graph showing a relationship between an amount of external static electricity (an electrostatic amount) and the 0 G output according to the first embodiment of the present invention.

Incidentally, FIG. 18 shows an experimental result of investigating on how a relationship between an external static electricity amount and the 0 G output is changed in accordance with the presence or absence of the electrostatic shield 34. It is found from FIG. 18 that when the electrostatic shield 34 is provided, a situation where the 0 G output is extremely varied by the influence of static electricity from outside, can firmly be prevented.

Additionally, the burn-in processing for exposing at least the semiconductor sensor chip 21 and the seat 26 supporting the semiconductor sensor chip 21 to an atmosphere of a predetermined temperature for a predetermined period of time or more in a state where a predetermined voltage is applied on the semiconductor sensor chip 21, is performed and therefore, a dispersion in an initial characteristic of the 0 G output can be restrained and as a result, the yield in fabrication steps is promoted in cooperation with the constitution where the dimension of the air gap between the weight portion 23 and the seat 26 is set as described above.

Figure 19:
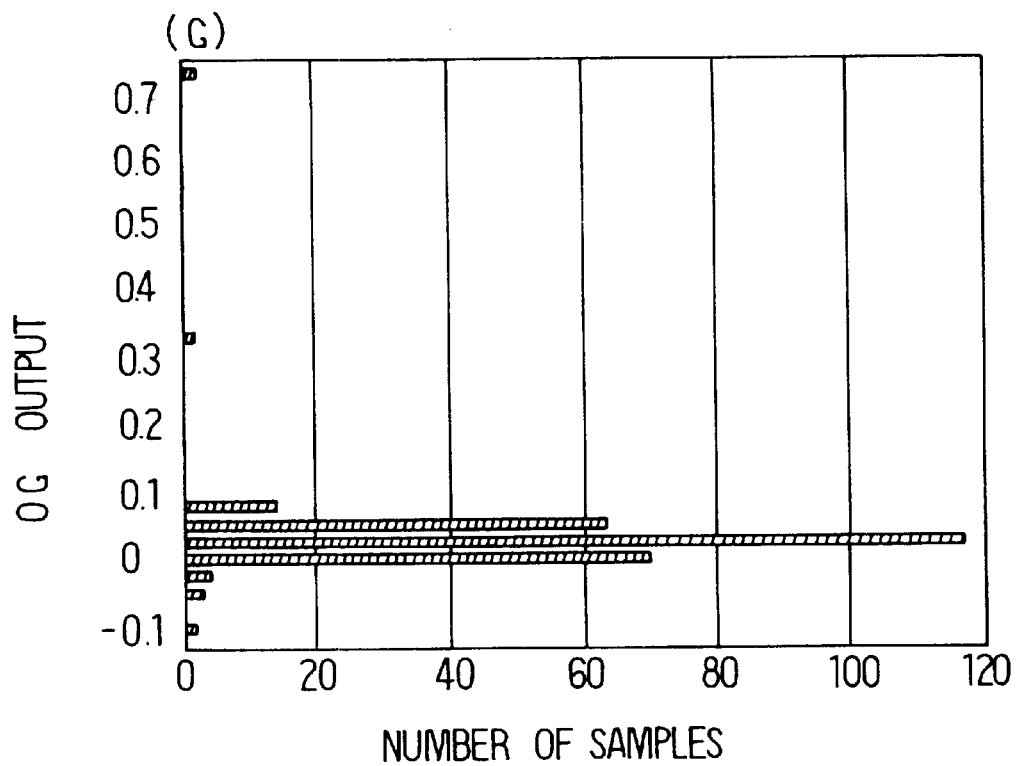
FIG. 19 is a graph showing a result of sampling values of the 0 G output after performing a burn-in processing according to the first embodiment of the present invention.

Incidentally, FIG. 19 shows a result of sampling a variational state of the 0 G output with respect to a number of the G sensors 25 which have been subjected to the burn-in processing. It is apparent from FIG. 19 that the amount of variation of the 0 G output is reduced with respect to almost all the samples and when the amount of variation of the 0 G output is allowable to, for example, ±0.1 G, the yield is promoted up to the vicinity of 99% and when it is allowable up to ±0.05 G which can deal with a severer requirement, the yield is promoted to 92% or more.

(Second Embodiment)

Figure 20:
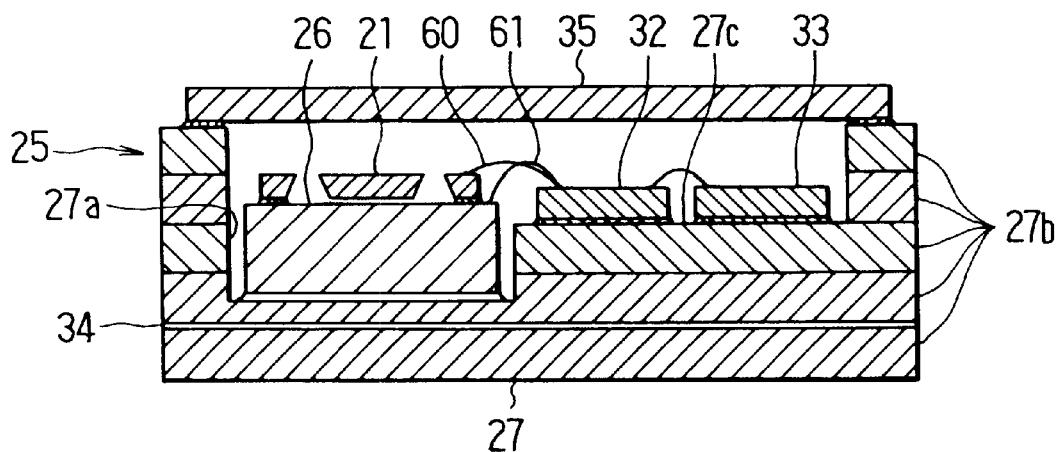
FIG. 20 is a longitudinal sectional view of an overall of a second embodiment of the present invention.
Figure 21:
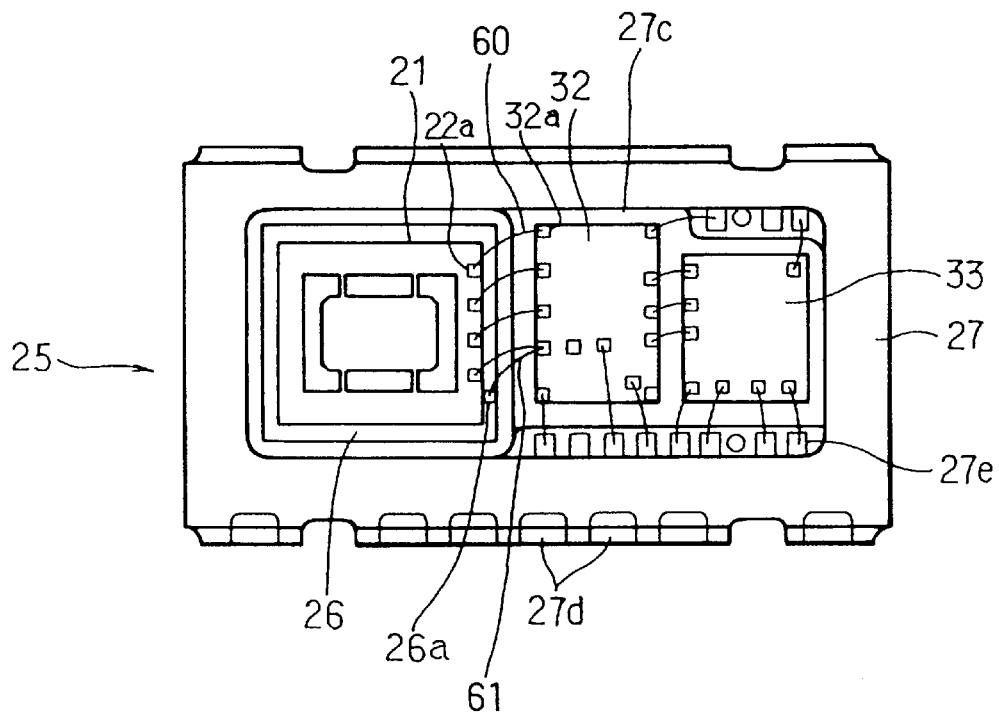
FIG. 21 is a plane view of the overall of the second embodiment of the present invention in a state where a lid is removed.
Figure 22:
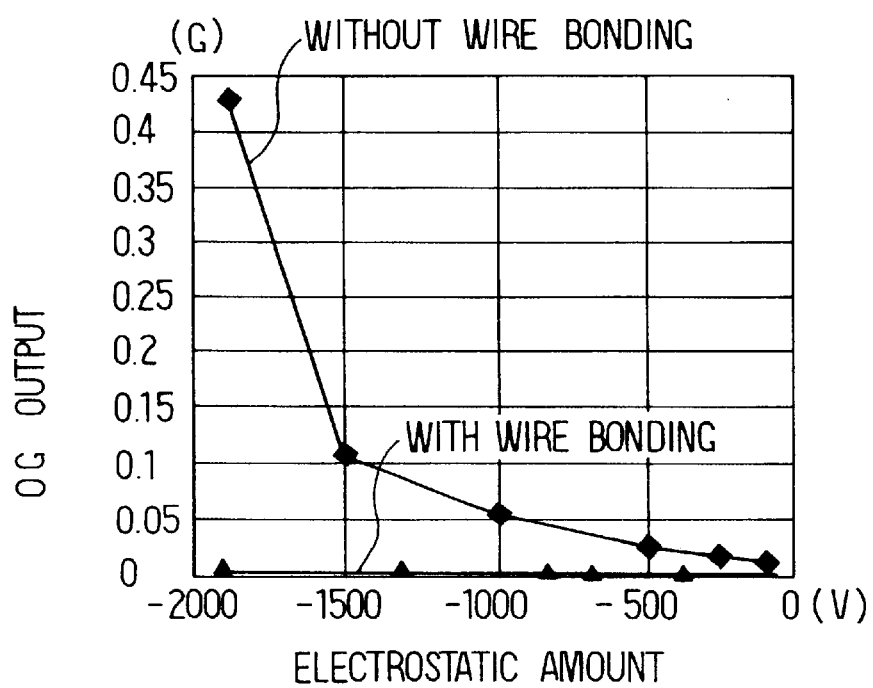
FIG. 22 is a graph showing a relationship between an amount of external static electricity (an electrostatic amount) and the 0 G output according to the second embodiment of the present invention.

FIG. 20 through FIG. 22 show the second embodiment of the present invention and an explanation will be given thereof as follows only with respect to portions different from those in the first embodiment.

In FIG. 21, the four bonding pads 22a (refer to FIG. 3 in the first embodiment) provided on the side of the semiconductor sensor chip 21, are connected to four bonding pads 32a provided on the side of the amplifying circuit 32 by bonding wires 60. In this case, one of the bonding pads 32a on the side of the amplifying circuit 32, for supplying power source voltage to the power source terminal +Vcc (refer to FIG. 3) of the semiconductor sensor chip 21, is connected to a bonding pad 26a formed at the seat 26 supporting for the semiconductor sensor chip 21 by a bonding wire 61 (corresponding to voltage applying means according to the present invention) as shown also by FIG. 20.

As a result of such a constitution, a voltage having a level the same as the level of the power source voltage applied to the semiconductor sensor chip 21 is applied on the seat 26 via the bonding wire 61. Accordingly, the potential levels of the seat 26 and the semiconductor sensor chip 21 can be maintained forcibility to the same level and accordingly and adverse influence caused by static electricity from outside can be excluded whereby an extreme variation of the 0 G output can be prevented beforehand.

Incidentally, FIG. 22 shows an experimental result of investigating on how the relationship between an external static electricity amount and the 0 G output is changed in accordance with the presence or absence of the bonding wire 61. It is known from FIG. 22 that when the bonding wire 61 is provided, a situation where the 0 G output is extremely varied by the influence of static electricity from outside can firmly be prevented.

Incidentally, although according to the embodiment, adverse influence caused by static electricity from outside is perfectly excluded by providing also the electrostatic shield 34, when the bonding wire 61 is installed, the electrostatic shield 34 may be provided as necessary.

(Third embodiment)

Figure 23:
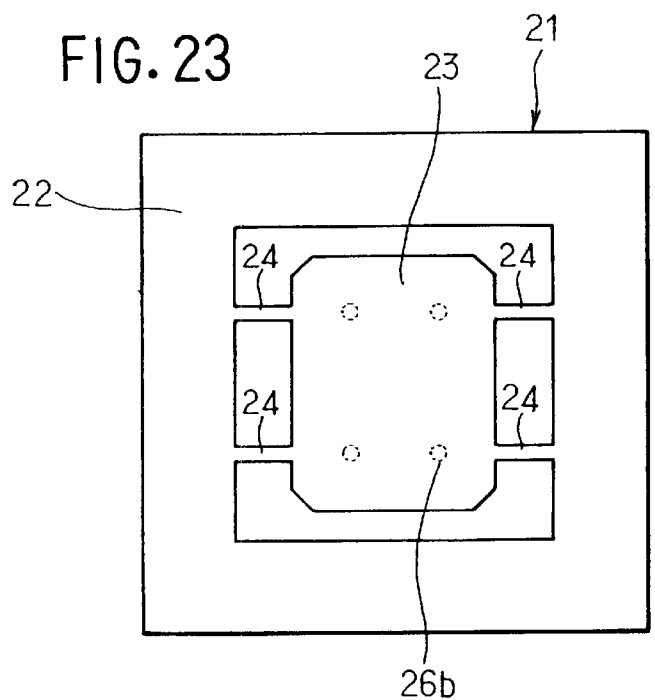
FIG. 23 is a plane view of a sensor chip and a seat portion according to a third embodiment of the present invention.
Figure 24:
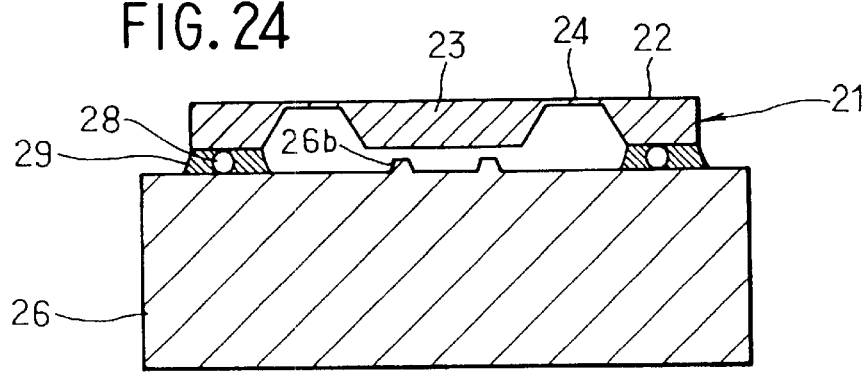
FIG. 24 is a longitudinal sectional view of the sensor chip and the seat portion according to the third embodiment of the present invention.

FIG. 23 and FIG. 24 show the third embodiment of the present invention formed by modifying the first embodiment and an explanation will be given only of portions different from those in the first embodiment as follows.

The third embodiment is featured in that by integrally forming, for example, four projections 26b on the side of the seat 26 opposed to the weight portion 23, the projections 26b are positioned at the air gap between the weight portion 23 and the seat 26 by which excessive deformation of the weight portion 23 is restricted by the projections 26b (the air gap is magnified in FIG. 24 for convenience of explanation).

In this case, the projections 26b are formed by performing, for example, an etching operation (anisotropic etching, electrochemical etching or the like) with respect to the seat 26 and according to the embodiment, the projections 26b are symmetrically arranged at positions corresponding to the four beams 24.

According to the embodiment constituted as described above, when the weight portion 23 is considerably deformed, the weight portion 23 is brought into contact with the projections 26b and further deformation of the weight portion 23 is restricted. As a result, even if a large acceleration is operated on the semiconductor sensor chip 21, a situation where an excessive torsional force is operated on the beams 24 can be prevented beforehand by which there is no concern of destructing the beams 24 and the reliability as a product is promoted.

Incidentally, although four pieces of the projections 26b are provided according to the third embodiment 3, the constitution may be provided with at least one of the projections and although the projections 26b are integrally formed with the seat 26 they may be provided by adhering projected portions comprising a separate material or the like. Further, projections may be provided on the side of the weight portion 23 to be opposed to the seat 26.

(Fourth Embodiment)

Figure 25:
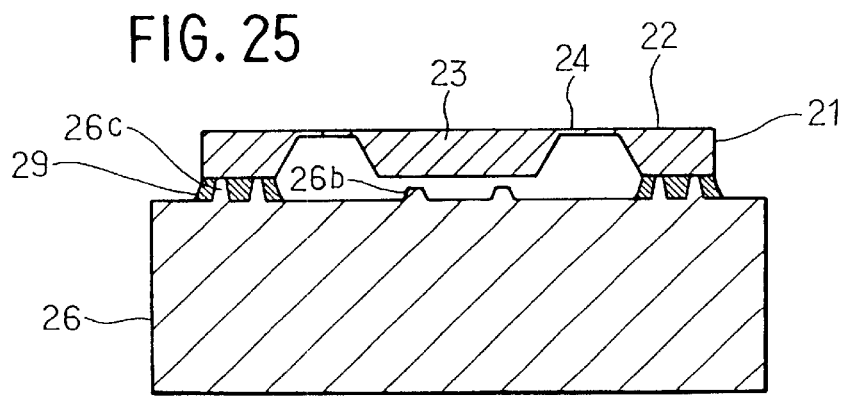
FIG. 25 is a longitudinal sectional view of a sensor chip and a seat portion according to a fourth embodiment of the present invention.

FIG. 25 shows the fourth embodiment of the present invention formed by modifying further the third embodiment and an explanation will be given of portions different from those in the third embodiment.

The fourth embodiment is featured in that the dimension of the air gap between the weight portion 23 and the seat 26 is controlled by a plurality of projections 26c (corresponding to spacers) integrally formed to the side of the seat 26 in place of the resin beads 28 in the first embodiment. In this case, the projections 26c are formed by etching the seat 26. However, as shown by FIG. 25, actually, the projections 26c and the projections 26b are formed with shapes thereof such as heights thereof different from each other and therefore, both are formed by performing etching operations at separate steps.

According to the fourth embodiment constituted as described above, there is provided an advantage of dispensing with the resin beads 28 (refer to FIG. 1) since the dimension control of the air gap between the weight portion 23 and the seat 26 is carried out by the projections 26c integrally formed with the seat 26.

Further, although the projections 26c are formed on the side of the seat 26 according to the fourth embodiment, projected portions functioning as spacers may be formed on the side of the frame 22 of the semiconductor sensor chip 21. Further, the projections 26b may be provided as necessary.

(Fifth Embodiment)

In the meantime, according to the first embodiment through the fourth embodiment, to realize downsizing of an overall of a sensor, the frame 22 for supporting the weight portion 23 via the beams 24 is adhered onto the seat 26 (to abolish a frame of a double structure), however, when an extremely high detection accuracy is needed to meet a usage as in, for example, a device for preventing transverse skidding in curving operation of an automobile, it is preferable to take in view of adoption of frame having a double structure.

FIG. 26 through FIG. 34 show the fifth embodiment of the present invention where a double frame structure as described above is adopted and an explanation will be given thereof as follows.

Figure 26:
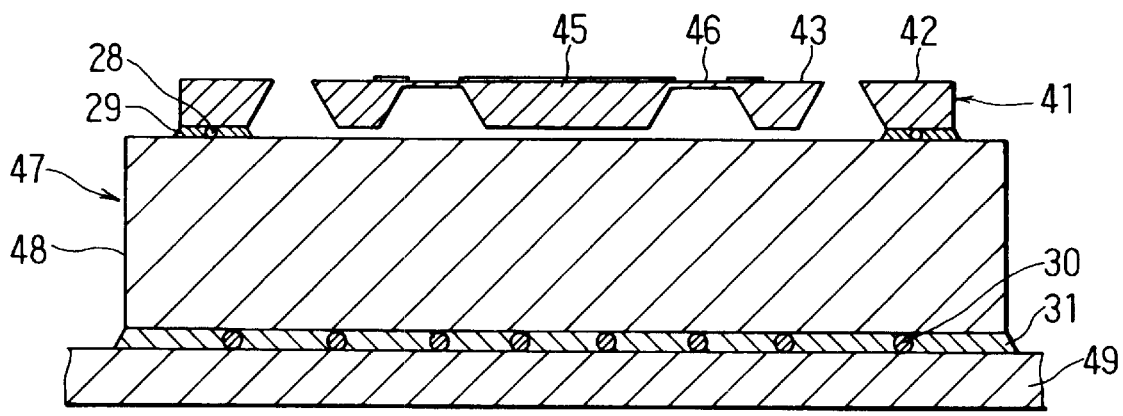
FIG. 26 is a longitudinal sectional view of essential portions according to a fifth embodiment of the present invention.
Figure 27:
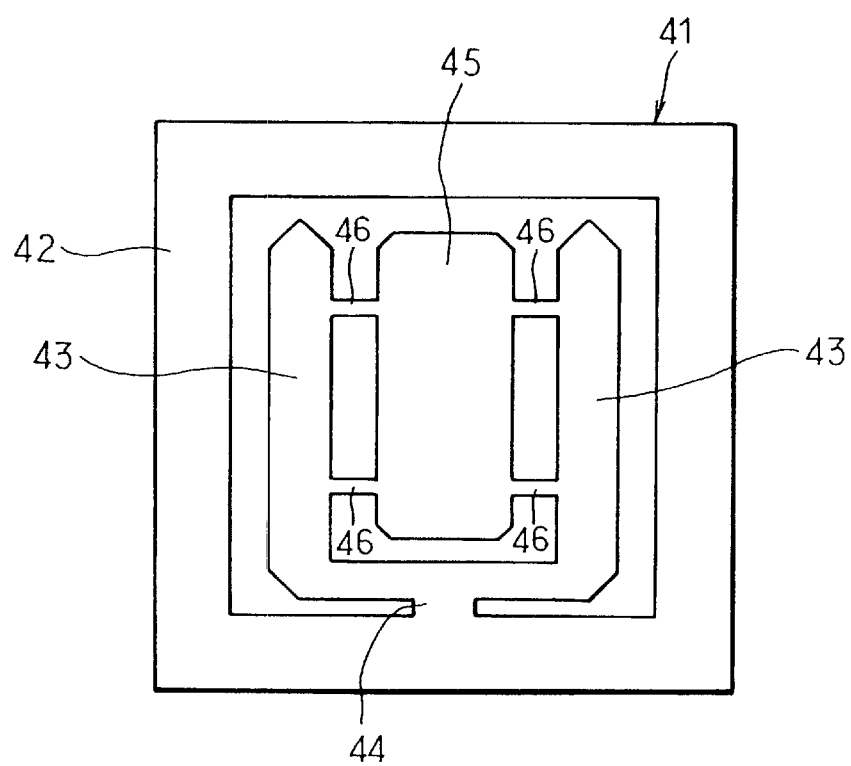
FIG. 27 is a plane view of a sensor chip according to the fifth embodiment of the present invention.
Figure 28:
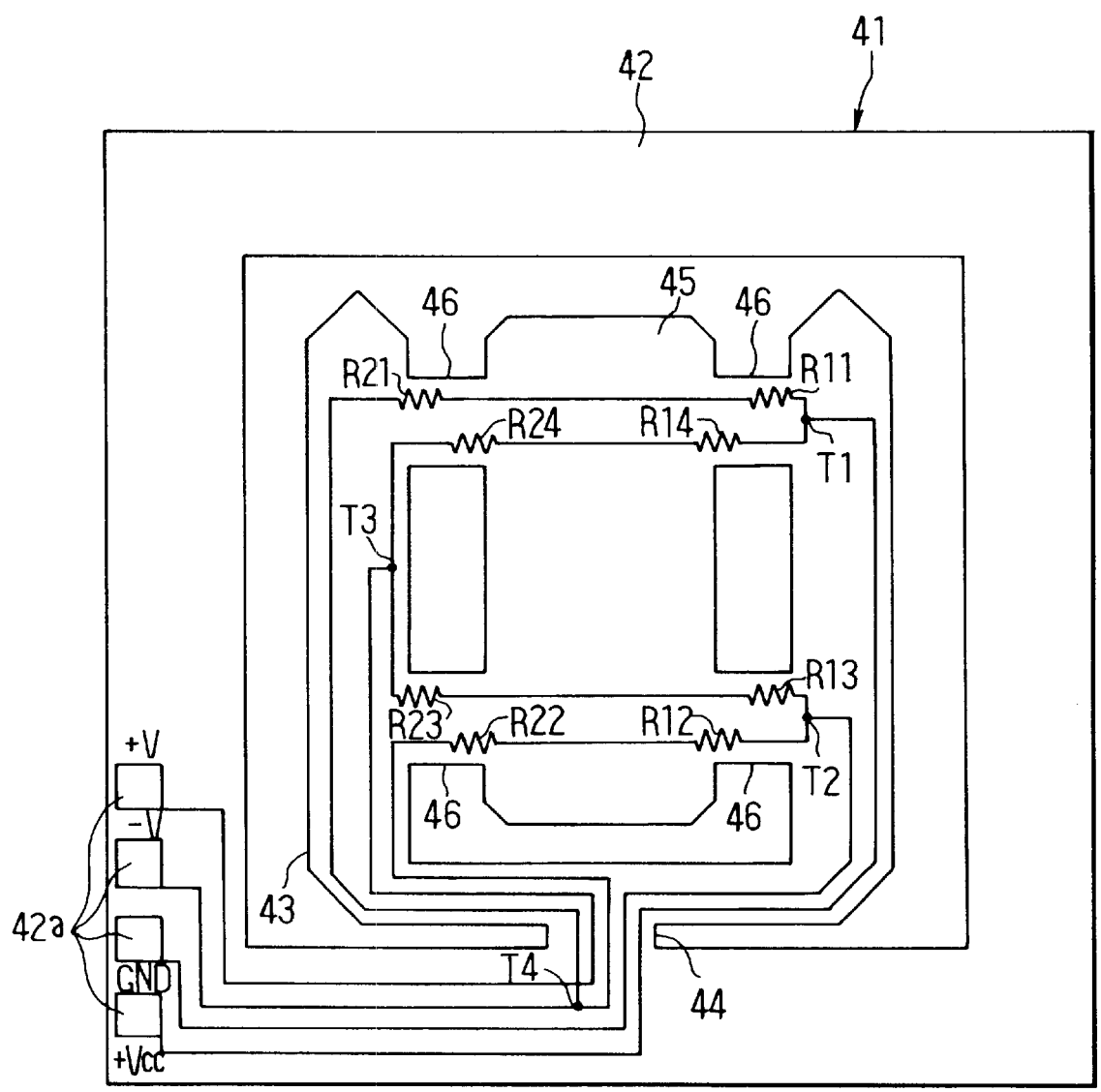
FIG. 28 is a diagram schematically showing the constitution of a bridge circuit formed in the semiconductor sensor chip according to the fifth embodiment of the present invention.

FIG. 26 shows a sectional structure of essential portions of a semiconductor acceleration sensor, FIG. 27 shows a planar shape of a semiconductor sensor chip constituting the core of the semiconductor acceleration sensor and FIG. 28 schematically shows the constitution of a bridge circuit formed on the semiconductor sensor chip.

In FIG. 27, a semiconductor sensor chip 41 is formed by electrochemically etching a material having a large piezoresistance coefficient such as a silicon single crystal substrate. A frame 43 (hereinafter, also referred to as inner frame) having an U-like shape is supported in a cantilever form with an arm 44 at an inner side of a rectangular auxiliary frame 42 (hereinafter, also referred to as an outer frame) having a thickness of about 300 μm and a size of about 7×7 mm through 8×8 mm. A weight portion 45 is supported in a both supported state at an inner side of the frame 43 via four beams 46 which are symmetrically arranged.

Similar to the first embodiment, the beams 46 are formed by using, for example, an epitaxial layer on a silicon single crystal substrate. Pairs of resistor elements (as shown by attaching symbols R11 through R14 and R21 through R24 in FIG. 28) are formed at the respective beams 46 by a diffusion process or the like and the acceleration is detected by a bridge circuit constituted by the resistor elements.

Specifically, as shown by FIG. 28, the respective pairs of resistor elements R11 and R14, R12 and R13, R21 and R24, R22 and R23 which are respectively formed at the beams 46 in a diffused form, are provided in a positional relationship where ones are contracted and others are elongated in accordance with displacement of the weight portion 45. Further, pairs of resistors located to be deformed in same states (R11 and R21, R13 and R23, R12 and R22, R14 and R24) are connected in series and a bridge circuit having pairs of series resistors at each side is formed. Furthermore, a pair of input terminals T1 and T2 and a pair of output terminals T3 and T4 are connected to four bonding pads 42a formed on the auxiliary frame 42 via a wiring pattern in a thin film shape.

The pair of input terminals T1 and T2 and the pair of output terminals T3 and T4 of the bridge circuit are electrically connected to respective bonding pads Vcc, GND, +V and −V for the four terminals via a wiring pattern formed on the surface.

In this case, a predetermined voltage is applied on the bonding pad Vcc and a voltage output is provided between the output terminal +V and −V when the weight portion 45 is dislocated by receiving acceleration. Incidentally, although not illustrated, an output voltage from the output terminals +V and −V is provided as an output for detecting acceleration via an amplifying circuit and a processing circuit.

The inner frame 43, the beams 46 and the weight portion 45 are formed by an anisotropic etching processing using an electrochemical etching process, as mentioned above, the beams 46 having a desired thickness dimension are formed by using both of an electrochemical stop etching step and a normal chemical etching step by utilizing a difference in conductive types of the silicon substrate and the epitaxial layer.

Further, in respect of the beams 46, the thickness dimension is constituted in a range of about 3.2 through 6.0 $\mu$m with about 4.7 $\mu$m as a median value, the width dimension is constituted in a range of about 220 through 280 $\mu$m with 250 $\mu$m as a median value and the length dimension is constituted in a range of about 470 through 530 $\mu$m with 500 $\mu$m as a median value. Further, the weight portion 45 is formed to have a weight of about 6.0 mg.

By setting the above-described respective dimensions, the value of the temperature coefficient of sensitivity TCS (ppm/°C.) as the characteristic of the entire of the sensor, is set to ±800 ppm/°C. or less and ±200 ppm/°C. or less with respect to the median value, as mentioned later. Thereby, when the embodiment is used as a semiconductor acceleration sensor for a device preventing transverse skidding of the vehicle, the variation degree of sensitivity can be restrained to a predetermined value or lower in the wide temperature range for use of about −30° C. to 80° C., and by compensating the value through a temperature compensating circuit or the like, the variation degree of sensitivity can finally and equivalently be restrained to 1 through 2% or less.

Further, when the temperature coefficient of sensitivity TCS is set to ±200 ppm/°C. or less, the variation degree of sensitivity can be restrained to 1 through 2% or lower by a constitution having no such temperature compensating circuit. Incidentally, when the temperature coefficient of sensitivity TCS is set to ±200 ppm/°C. or lower, an ideal characteristic is provided as described above, however, in practice, there are cases where it is difficult to set the value to ±200 ppm/°C. or lower in view of the yield in consideration of a dispersion in fabrication and accordingly, the sensor is manufactured with a basis of capability of dealing with the cases even if the temperature coefficient of the sensitivity is allowable to set to ±800 ppm/°C. or lower, as described above.

With respect to a seat 48 made of silicon that is interposed between the semiconductor sensor chip 41 and a housing (ceramic substrate) 49, the thickness dimension D is set to about 1.8 mm (larger than 1 mm) and intermediaries therewith are fixedly adhered by the flexible adhesive agents 29 and 31. In this case, the semiconductor sensor chip 41 is adhered onto the seat 48 at the portion of the outer frame 42.

According to the flexible adhesive agents 29 and 31, a plurality of resin beads 28 and 30 as spacers are mixed to a base adhesive agent. The base adhesive agent uses silicone resin that is a kind of flexible resin and the modulus of elasticity of silicone resin is about 1 MPa.

Further, the flexible adhesive agent 29 provided between the semiconductor sensor chip 41 and the seat 48 is mixed with the resin beads 28 having a predetermined particle size. Therefore, under the adhesive state, the dimension of the air gap between the weight portion 45 of the semiconductor sensor chip 41 and the seat 48 is set to about 10 through 22 $\mu$m by which air damping is carried out.

In the above-described case, in respect of a flexible resin of a base adhesive agent, the modulus of elasticity is preferably 500 MPa or lower and other than silicone resin as described above, for example, urethane resin, acrylic resin, polyamide resin, polyimide resin or flexible epoxy resin or the like may be used.

Further, the resin beads are generally provided with a low modulus of elasticity and with respect to the resin beads 28 and 30 which are used in the fifth embodiment, the modulus of elasticity is preferably 10 GPa or lower. In order to satisfy such a requirement, polydivinylbenzene resin, silicone resin, urethane resin, acrylic resin, polyimide resin, flexible epoxy resin, vinyl resin and the like may be utilized.

According to the above-described constitution, when the acceleration in the horizontal direction is acted on the semiconductor acceleration sensors which are located orthogonally to each other, components of the acceleration respectively in accordance with directions of two of the semiconductor acceleration sensors are received by the two semiconductor acceleration sensors. In the semiconductor acceleration sensor, the weight portion 45 of the semiconductor sensor chip 41 receives a force in accordance with the acceleration in a direction opposed to a direction of the acceleration. When the weight portion 45 is dislocated in the direction of receiving the force thereby, the four beams 46 supporting the weight portion 45 are distorted.

At this moment, when, for example, the weight portion 45 is dislocated to the side of the seat 48, the respective beams 46 receive compressive stresses at positions on the side of the weight portion 45 and receive tensile stresses at positions on the side of the inner frame 43. Thereby, the resistances of the respectively formed diffused resistors are changed by the piezoresistance effect. Then, a voltage output is provided between the output terminals +V and −V in accordance with changes in the resistances at respective resistors connected in a bridge.

Further, when an excessive acceleration is applied, since the clearance between the weight portion 45 and the seat 48 has the effect of an air damper, the weight portion 45 and the beams 46 can be prevented from destructing.

Next, data for clarifying the bases of adopting the above-described constitution will be shown. That is, the thickness dimension of the beams 46 of the semiconductor sensor chip 41 is set in a range of 3.2 $\mu$m through 6.0 $\mu$m as described above, based on a result of new recognition as follows by the inventors similar to the first embodiment.

That is, based on the discovery where the thickness dimension of the beams 46 influences the temperature variation of sensitivity in correspondence with temperature variation of an environment of using the semiconductor sensor chip 41, the inventors prepared the samples having various sizes in the thickness dimension and the respective temperature coefficients of sensitivity TCS (ppm/°C. were measured.

Figure 34:
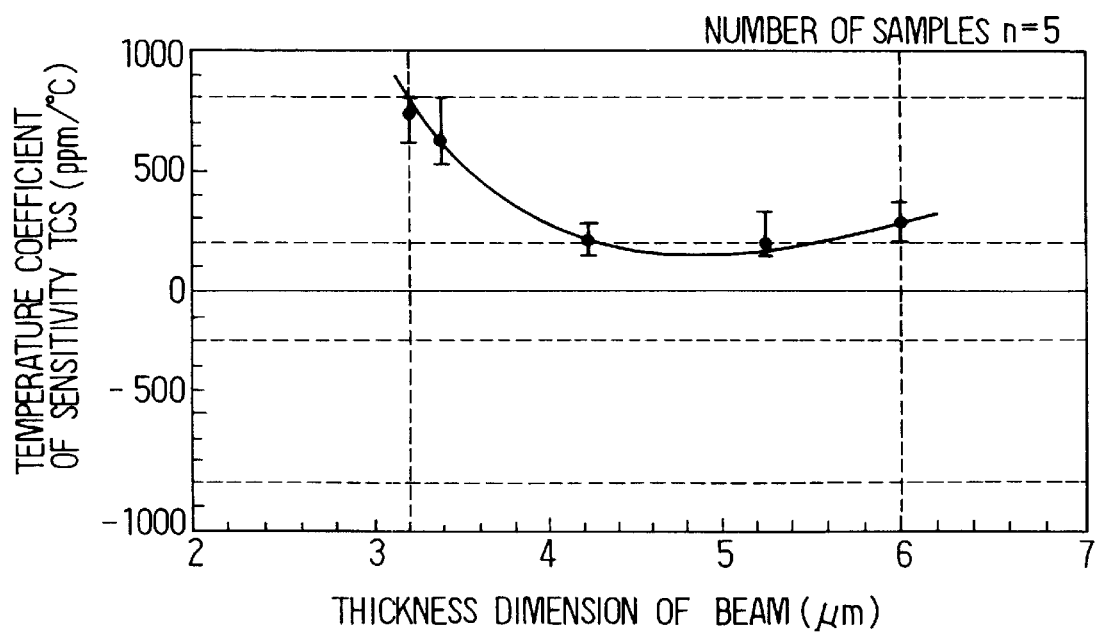
FIG. 34 is a correlation diagram between a thickness dimension of a beam and a temperature coefficient of sensitivity according to the fifth embodiment of the present invention.

As a result, as shown by FIG. 34, it was found that the temperature coefficient of sensitivity TCS was within ±800 ppm/°C. when the thickness dimension of the beams 46 was set to a value of 3.2 $\mu$m or higher. Further, in practical point of view, with respect to upper limit value, the thicker the thickness dimension of the beams 46, the more deteriorated was the detection sensitivity per se and accordingly, it was found that about 6.0 μm was an upper limit when acceleration of about ±1 G was detected.

Incidentally, when the temperature coefficient of sensitivity TCS is set to ±800 ppm/°C. or less as mentioned above, the maximum degree of sensitivity variation may not be at about 1 through 2% or lower, however, in the case of degree of sensitivity variation to such a degree, by providing a temperature compensating circuit or the like at an output side, the error with respect to temperature variation in the temperature changing range of an object of detection can be compensated.

Further, when the thickness dimension of the beams 46 is set such that the temperature coefficient of sensitivity TCS becomes ±200 ppm/°C. or less (a range of about 4.2 through 5.2 μm in FIG. 34), accurate detection operation can be performed without providing a temperature compensating circuit as described above. Further, in this case, the value of the degree of variation of sensitivity ΔS as shown by Equation (2) and Equation (4), is calculated as about 1.1% and in a semiconductor acceleration sensor for a device for preventing transverse skidding of the vehicle, if the value of the variation degree of sensitivity Δs is about 1 through 2% or less, a very small acceleration of about ±1 G can accurately be detected and therefore, the condition is satisfied.

According to the fifth embodiment, in respect of the constitution of the semiconductor sensor chip 41, the inner frame 43 supporting the weight portion 45 is held by the outer frame 42 adhered to the seat 48 via the connecting portion 44 having a large thickness and the weight portion 45 is arranged at a position adjacent to the seat 48 by which the air damping is conducted and accordingly, small acceleration of about ±1 G can accurately be detected over a wide operational temperature range.

Further, although not specifically illustrated, an amplifying circuit having functions of supplying power source voltage on the semiconductor sensor chip 41 and amplifying an output detected by the sensor chip 41, and an adjusting circuit for adjusting the level of the power source voltage applied on the amplifying circuit and the like are mounted on a thick film substrate 49. Further, the thick film substrate 49 mounted with the semiconductor sensor chip 41, the amplifying circuit and the like in this way, is housed in a case made of, for example, a metal having terminals for inputting and outputting.

Further, when the dimension of the air gap between the weight portion 45 and the seat 48 is designated by notation d, and the bottom area of the weight portion 45 is designated by notation S, the values of the dimension of the air gap d and the bottom area of the weight portion 45 are set so that the relationship between the dimension of air gap d and the bottom area S, satisfies the following equation (7).

$$0.01 \leq S/d^2 \leq 0.05 \qquad (7)$$

According to the constitution of the fifth embodiment, the following operation and effect can be achieved.

According to the fifth embodiment, the vibration of the weight portion 45 is attenuated by the air damping between the weight portion 45 and the seat 48 by setting the dimension of the air gap between the weight portion 45 of the semiconductor sensor chip 41 and the seat 48 supporting the sensor chip 41 to a range of 10 through 22 μm.

The inventors of the application found by experiment a relationship between the vibration of the weight portion 45 and the dimension of the air gap between the weight portion 45 and the seat 48 with respect to the G sensor 47 having the double frame structure according to the fifth embodiment, that is, with respect to the G sensor 47 having the semiconductor sensor chip 41 comprising the auxiliary frame 42, the frame 43 supported at the inside of the auxiliary frame 42 in a cantilever shape with the arm 44 and four of the beams 46 provided at the inside of the frame 43 to support the weight portion 45 in both supported shape whereby acceleration of up to about ±1 G can be detected by utilizing the piezoresistance effect of the resistor elements formed at the beams 46. The content of the experiment is to investigate a vibration attenuating amount (air damping characteristic) under a state where vibration is applied on the weight portion 45 of the G sensor 47 and the experimental data is shown by FIG. 30.

Figure 30:
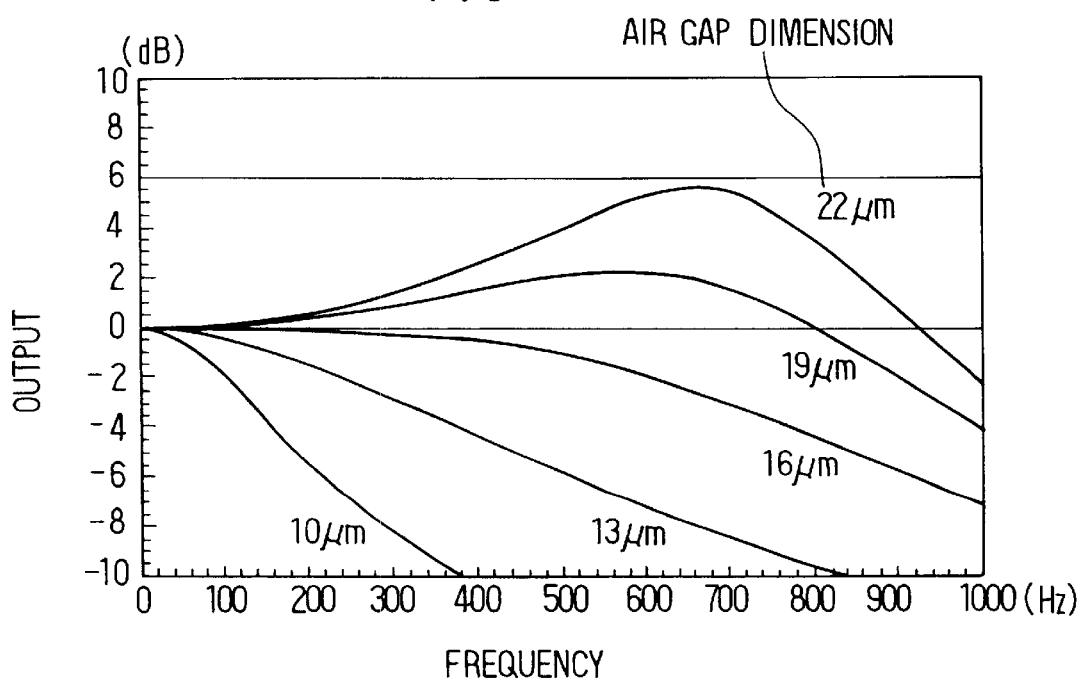
FIG. 30 is a graph showing air damping characteristics with the air gap dimension as a parameter according to the fifth embodiment of the present invention.

As is apparent from FIG. 30, when the dimension of the air gap between :the weight portion 45 and the seat 48 is about 22 μm or lower, a sufficient air damping effect is provided even under a comparatively severe requirement where the allowable range of the vibration attenuating amount is about 6 dB or lower. As a result, deterioration of the output characteristic of the G sensor 47 caused by the vibration of the weight portion 47 can be prevented.

Further, according to the fifth embodiment, the lower limit value of the dimension of the air gap between the weight portion 45 and the seat 48 is set to 10 μm based on the reason as follows.

Figure 29:
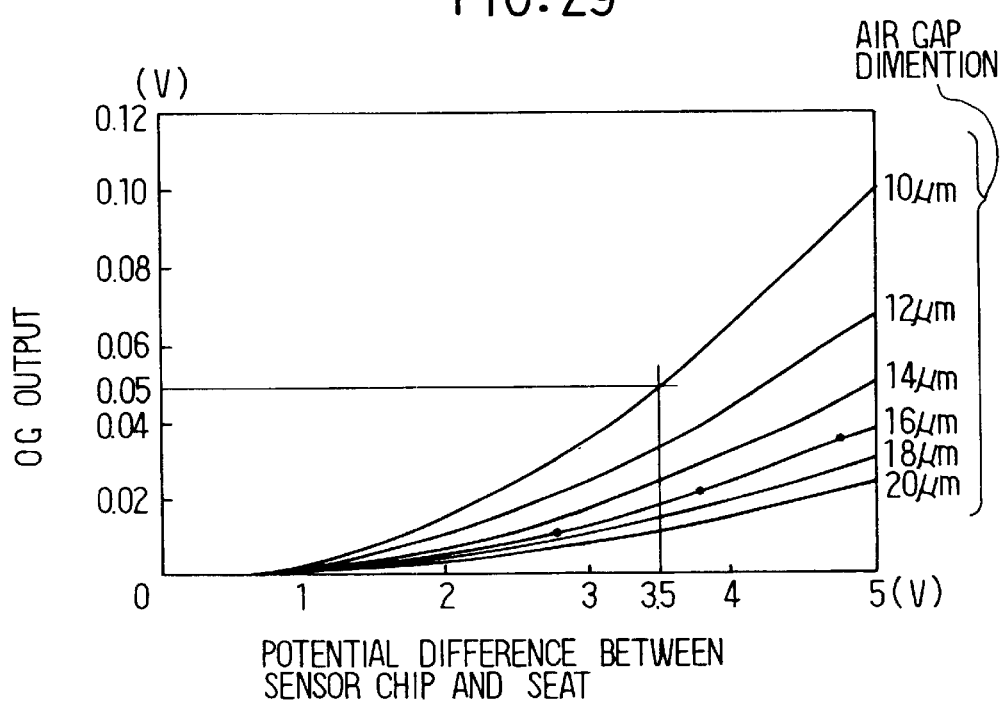
FIG. 29 is a graph showing a relationship between a potential difference between the sensor chip and a seat and the 0 G output with an air gap dimension as a parameter according to the fifth embodiment of the present invention.

That is, in order to investigate on a phenomenon that the 0 G output of the G sensor 47 is dispersed by an electrostatic attraction operating between the weight portion 45 and the seat 48, the inventors of the application confirmed by calculation and experiment the effect of the dimension of the air gap between the weight portion 45 and the seat 48 on the 0 G output. FIG. 29 shows a result of calculating a relationship between the potential difference between the semiconductor sensor chip 41 and the seat 48, and the variation amount of the 0 G output under a state where the dimension of the air gap is changed from 10 μm to 20 μm with an increment of 2 μm. The result of the calculation is shown by curves of solid lines. Further, FIG. 29 shows values of actually is measuring the relationship between the potential difference and the 0 G output by black circles under a state where the dimension of the air gap is 16 μm.

As is apparent from FIG. 29, the result of the calculation and the measured values almost coincide with each other. As has been explained in the first embodiment, to confine the variation of the 0 G output in an allowable range by reducing the electrostatic attraction operating between the weight portion 45 and the seat 48, the dimension of the air gap between the weight portion 45 and the seat 48 must be enlarged to some degree. In the fifth embodiment, based on the characteristic as shown by FIG. 29 and the situation where the potential difference in design applied between the semiconductor sensor chip 41 and the seat 48 is about 3.5 V, the dimension of the air gap is set to 10 μm or more when the allowable range of the variation in the 0 G output is 0.05 V or lower which is a comparatively severe requirement.

After all, as a result of setting the dimension of the air gap as described above, deterioration of output characteristic caused by the vibration of the weight portion 45 can be prevented and further, deterioration of output characteristic caused by the electrostatic attraction generated at the inside can simultaneously be prevented whereby a stable output characteristic which can deal with a severe requirement as in that for a device for preventing transverse skidding in curving operation of an automobile, can be provided.

Further, it is actually preferable to determine the dimension of the air gap between the weight portion 45 and the seat 48 also in consideration of the magnitude of the bottom area of the weight portion 45 effecting an influence on the air damping characteristic. According to the fifth embodiment, as shown by Equation (7), when the dimension of the air gap is designated by notation d and the bottom area is designated by notation S, the value of $S/d^2$ is set to a range of 0.01 through 0.05 by which stabilization of the 0 G output is achieved.

In the fifth embodiment, the maximum value of $S/d^2$ is set to 0.05 and the minimum value is set to 0.01 by the following reason.

Figure 31:
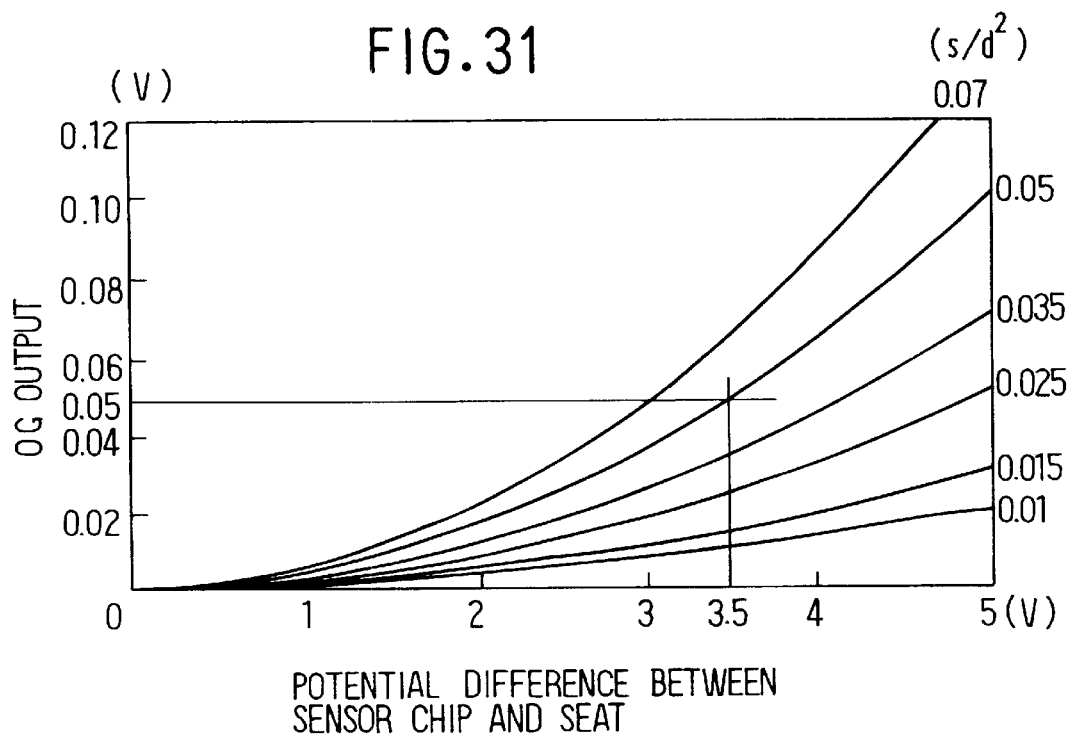
FIG. 31 is a graph showing a relationship between the potential difference between the sensor and the seat and the 0 G output with a value of $S/d^2$ (S; bottom area of weight portion, d; air gap dimension) as a parameter according to the fifth embodiment of the present invention.

That is, in order to confirm the influence of the value of $S/d^2$ on the 0 G output, the inventors of the application calculated how the relationship between the potential difference between the semiconductor sensor chip 41 and the seat 48, and the variation amount of the 0 G output, is changed in accordance with the value of $S/d^2$ (0.01–0.07 in an example of FIG. 31), as shown by FIG. 31.

As is apparent from FIG. 31, in order to confine the variation of the 0 G output in the allowable range, the value of $S/d^2$ must be decreased to some degree. That is, based on the characteristic as shown by FIG. 31 and the situation where the potential difference in design applied between the semiconductor sensor chip 41 and the seat 48 is about 3.5 V, the value of $S/d^2$ must be set to 0.05 or less when the allowable range of the variation of the 0 G output is 0.05 V or lower which is a comparatively severe requirement.

Further, the inventors of the application found by experiment the relationship between the vibration of the weight portion 45 and the value of $S/d^2$ with respect to the G sensor 47. The content of the experiment is to investigate on the vibration attenuating amount under a state where the vibration is applied on the weight portion 45 of the G sensor 47 and the experimental data is shown by FIG. 32.

Figure 32:
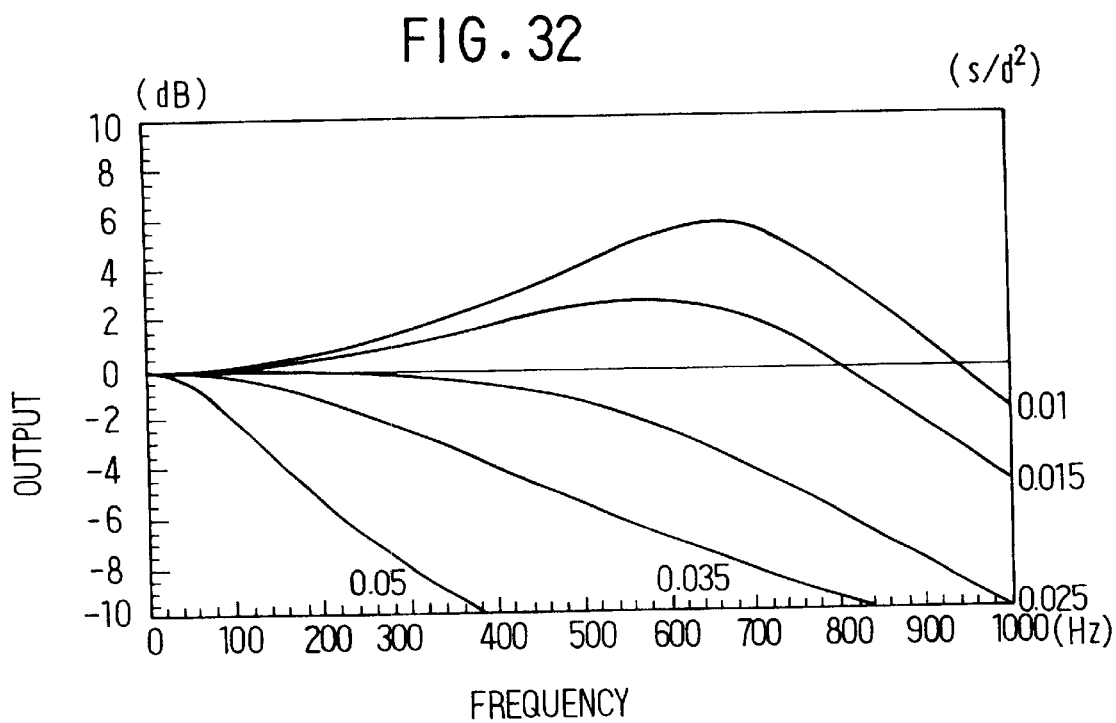
FIG. 32 is a graph showing air damping characteristics with the value of $S/d^2$ as a parameter according to the fifth embodiment of the present invention.

As is apparent from FIG. 32, when the value of $S/d^2$ is 0.01 or more, a sufficient air damping effect can be provided in a comparatively severe requirement where the allowable range of the vibration attenuating amount is about 6 dB or lower.

Figure 44:
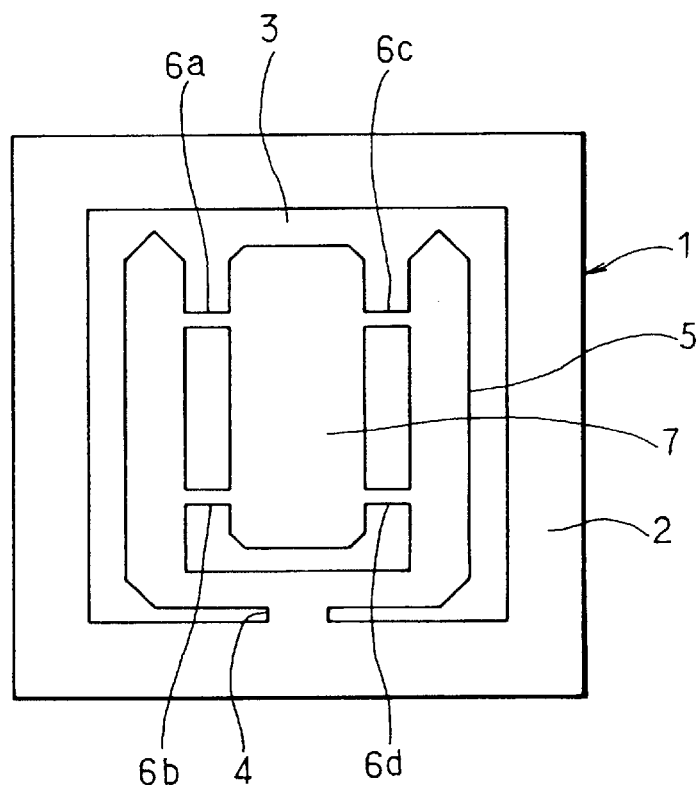
FIG. 44 is a plane view of a sensor chip showing a conventional example.
Figure 45:
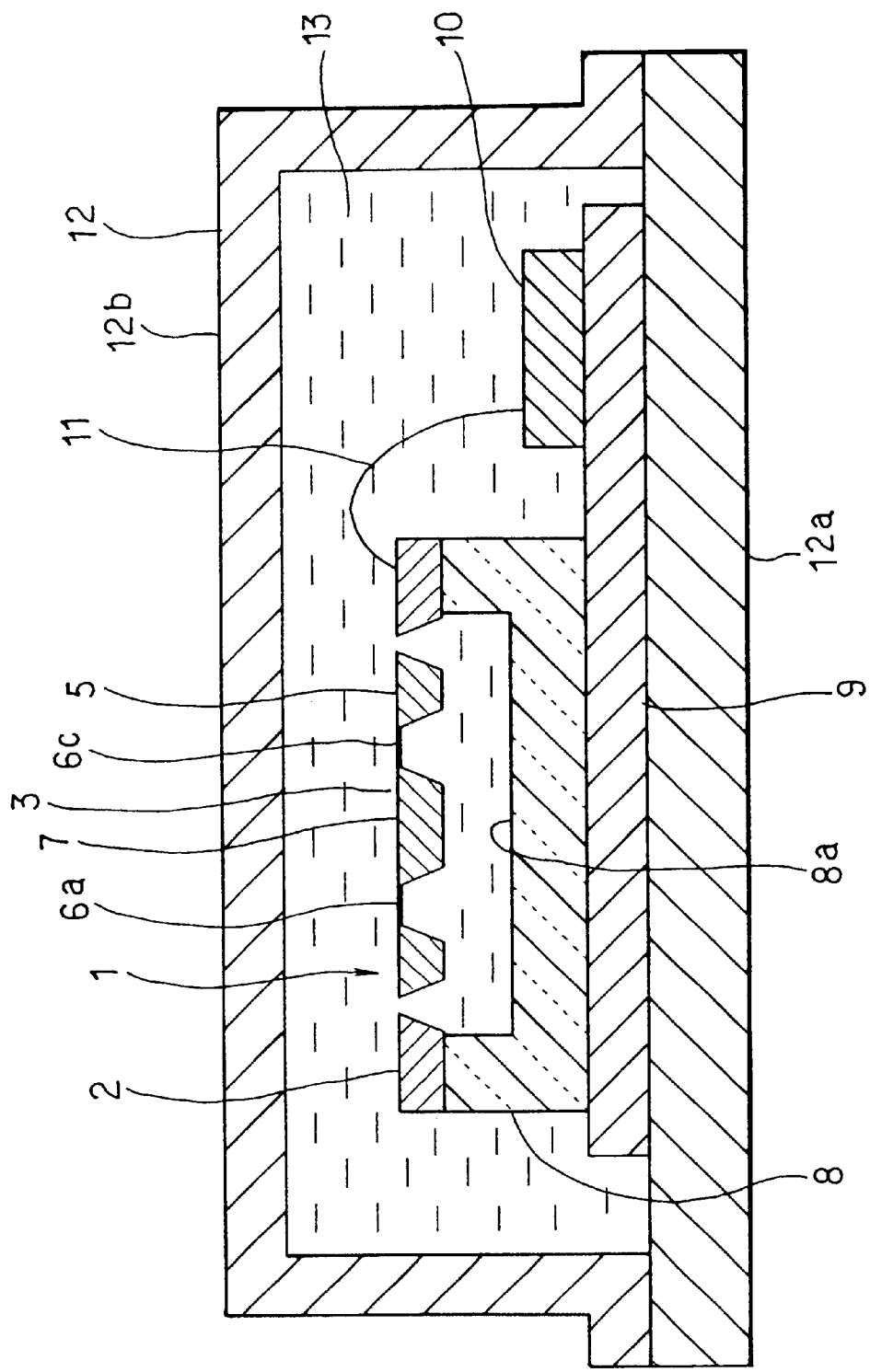
FIG. 45 is a longitudinal sectional view showing a mounting state of the conventional example.

Meanwhile, the semiconductor sensor chip 41 used in the fifth embodiment has a shape basically similar to that of the semiconductor sensor chip of the conventional constitution (as shown in FIG. 44). However, according to the fifth embodiment, the semiconductor sensor chip 41 is adhered onto the seat 48 having the thermal expansion coefficient equivalent to that of the semiconductor sensor chip 41 by the flexible adhesive agent 29 and further, an oil less air damping is carried out and accordingly, the temperature characteristic is superior to that of the conventional product where the semiconductor sensor chip 1 is anodically bonded onto the glass seat 8 and oil damping is carried out.

Figure 33:
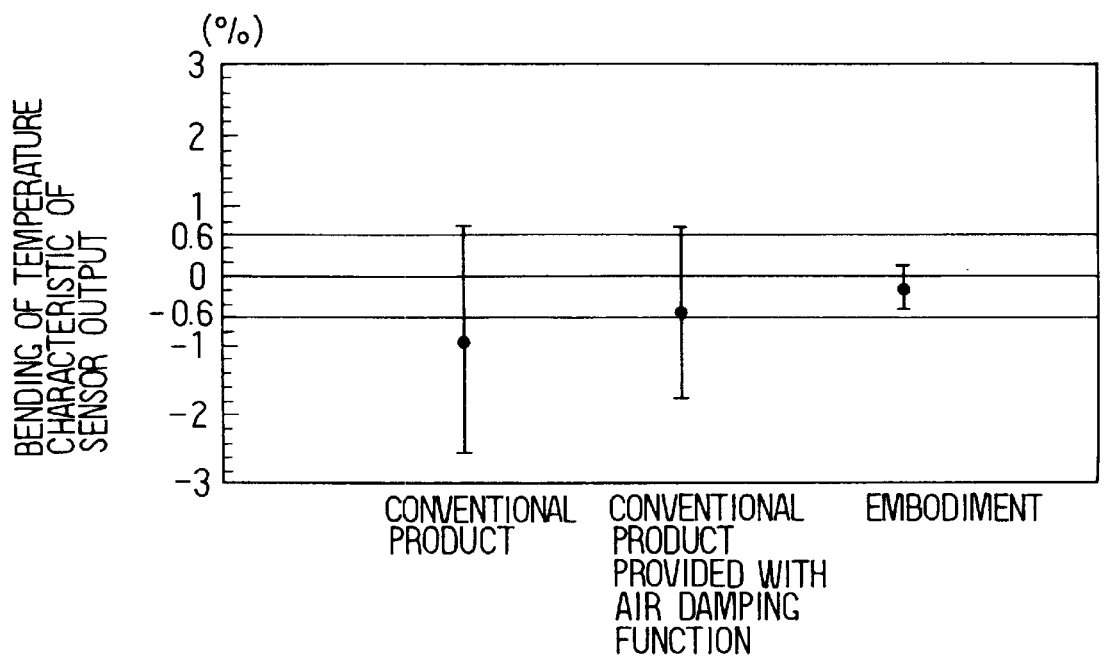
FIG. 33 is a graph showing a result of measuring bending of temperature characteristic of sensor output according to the fifth embodiment of the present invention.

That is, FIG. 33 shows a result of measuring bending point of temperature characteristic of a sensor output with respect to a plurality of samples of the conventional G sensor (anodically bonded, with oil for damping), a G sensor (anodically bonded, without oil for damping) which carries out air damping in a conventional product and the G sensor 47 according to the fifth embodiment.

FIG. 33 shows distributions of measurement results (median values are represented by black circles) and as can be understood from FIG. 33, according to the G sensor 47 of the fifth embodiment, even if the allowable range of bending point of the temperature characteristic is 0.6% or lower which is a comparatively severe requirement, the requirement is sufficiently satisfied.

Incidentally, the electrostatic shield similar to that in the first embodiment can be provided to the G sensor 47 according to the fifth embodiment. Further, the constitution as in the second embodiment (constitution of forcibly maintaining potentials of the seat 48 and the semiconductor sensor chip 41 at same level), the constitution as in the third embodiment (constitution of providing projections for restricting the excessive deformation of the weight portion 45) and the constitution as in the fourth embodiment (constitution of providing projections in place of the resin beads 28 as spacers) can also be applied to the fifth embodiment.

(Sixth Embodiment)

FIG. 35 through FIG. 40 show the sixth embodiment of the present invention and an explanation will be given only portions different from those in the first embodiment as follows.

Figure 35:
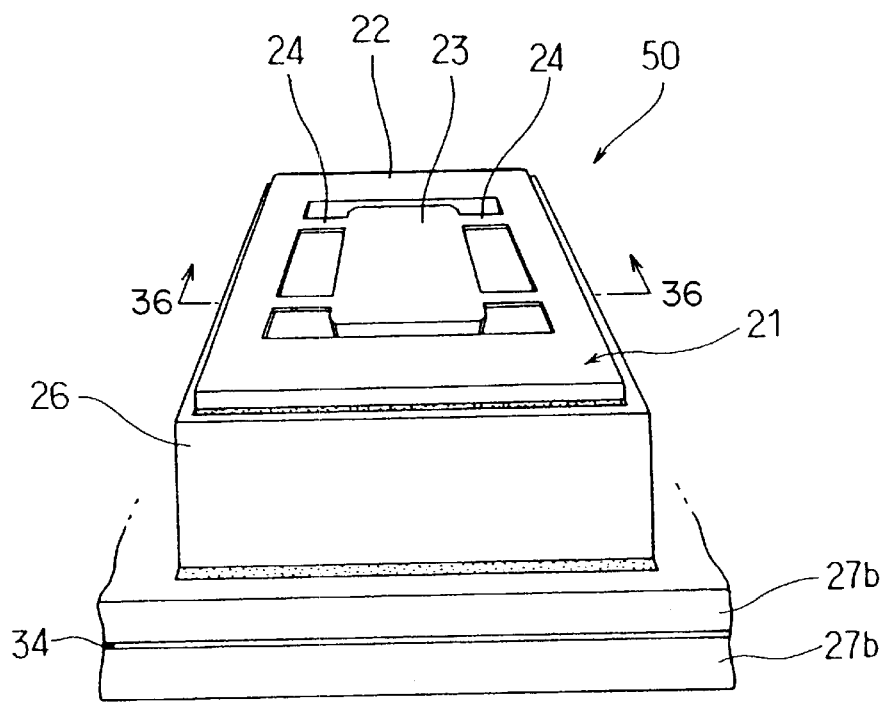
FIG. 35 is a perspective view of essential portions according to a sixth embodiment of the present invention.
Figure 36:
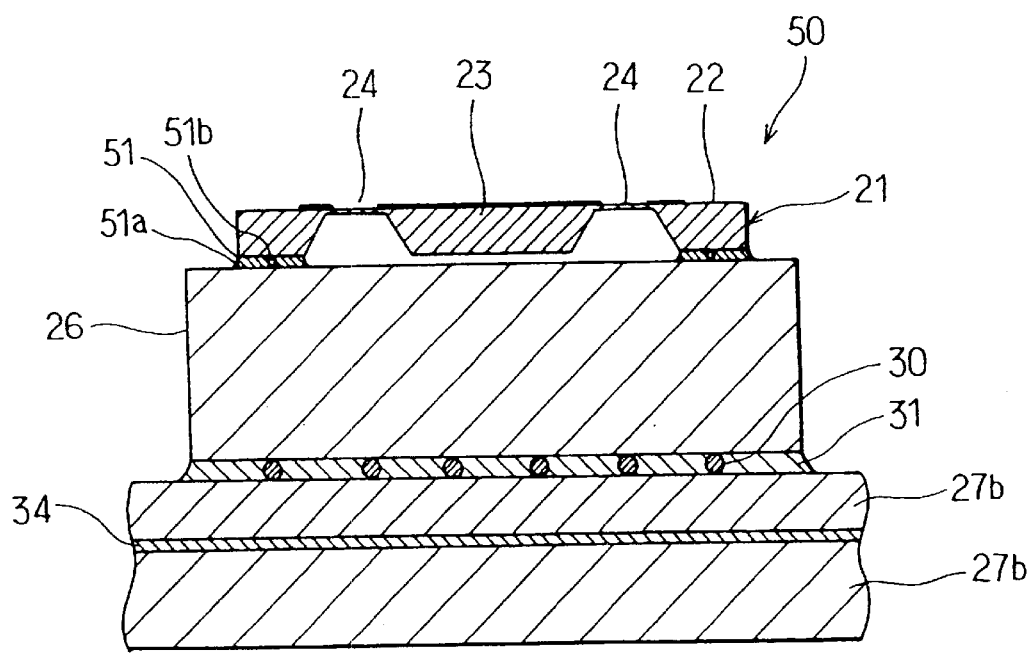
FIG. 36 is a sectional view taken from a line 36—36 of FIG. 35.

FIG. 35 shows an outlook of a semiconductor acceleration sensor and FIG. 36 shows a sectional structure taken from a line 36—36 of FIG. 35. In FIG. 35 and FIG. 36, according to a semiconductor acceleration sensor 50 (hereinafter, referred to as G sensor), a semiconductor sensor chip 21 having a constitution similar to that in the first embodiment, is supported by a seat 26 via a frame 22 thereof and an integrated body of the semiconductor sensor chip 21 and the seat 26, is adhered onto a ceramic substrate 27b constituting a housing 27. Incidentally, the flexible adhesive agent 31 mixed with a plurality of the resin beads 30 is used in the adhering operation.

According to a G sensor 50 of the sixth embodiment, the frame 22 and the seat 26 are adhered to each other by a bonding material 51 as a supporting member. The bonding material 51 is constituted by mixing a plurality of resin beads 51b for spacers (having a diameter of, for example, about 8 μm) to a flexible adhesive agent 51a by, for example, about 0.1 wt %. In this case, at least one of the plurality of resin beads 51b is formed by a conductive bead the surface of which is plated (coated) with a conductive material, for example, gold by which the resistance value between the semiconductor sensor chip 21 and the seat 26 via the bonding material 51 is set to $10^{10}$ Ω or lower.

Figure 37:
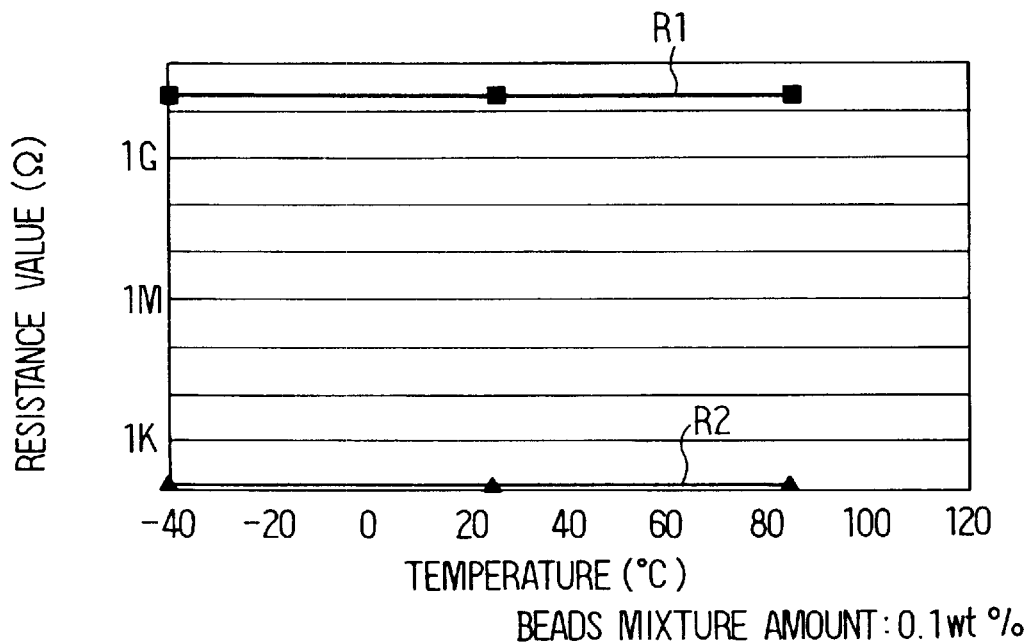
FIG. 37 is a graph showing a result of evaluating resistance value of a bonding material according to the sixth embodiment of the present invention.

Here, FIG. 37 shows a result of evaluating a resistance value R1 of the bonding material 51 when no conductive bead is included in the group of the resin beads 51b, and a resistance value R2 of the bonding material 51 when all of the group of the conductive beads 51b are constituted by conductive beads in a general temperature range for use of the G sensor 50 (−30° C. to 85° C.). Incidentally, the characteristic of FIG. 37 shows an example when the mixture ratio of the resin beads 51b is 0.1 wt %, the resistance value of the resin beads 51b when they are not plated with gold is $2.9 \times 10^{12}$ Ω and the resistance value of the resin beads 51 which are plated with gold is several tens Ω.

According to the result of evaluation shown by FIG. 37, the resistance value R2 of the bonding material 51 when the all of the group of the resin beads 51b comprise the conductive beads is about 100 Ω. Actually, the ratio of conductive beads in the resin beads 51b may be determined such that the resistance value between the semiconductor sensor chip 21 and the seat 26 under a state where they are bonded by the bonding material 51 becomes $10^{10}$ Ω or lower. When the resin beads plated with gold are used as in the sixth embodiment, if at least one of the conductive beads in resin beads 51b is brought into a state where the semiconductor sensor chip 21 and the seat 26 are electrically connected, the resistance value between the semiconductor sensor chip 21 and the seat 26 via the bonding material. 51 become $10^{10}$ Ω or lower.

Incidentally, it is preferable that the modulus of elasticity of the flexible adhesive agent 51a used in the sixth embodiment is 500 MPa or lower and for example, silicone resin, urethane resin, acrylic resin, polyamide resin, polyimide resin, flexible epoxy resin or the like is used therefor. Further, the modulus of elasticity of the resin beads 51b is preferably 10 GPa or lower and therefore, polydivinylbenzene resin, silicone resin, urethane resin, acrylic resin, polyimide resin, flexible epoxy resin, vinyl resin or the like is utilized.

Further, an amount of the resin beads 51b mixed to the bonding material 51 is determined in consideration of the situation mentioned below.

That is, the inventors of the application carried out a low temperature leave test that was a temperature stress test by preparing various samples with respect to the G sensor 50 from a sample where the resin beads 51b were not mixed in the bonding material 51 to a sample where about 0.55 wt % thereof was mixed. According to the low temperature leave test, a procedure where after a sensitivity S0 of a sample was measured under a room temperature state, the sample was left in an atmosphere of −40° C. for a predetermined period of time and thereafter, the temperature of the sample was recovered to room temperature and a sensitivity S1 was measured, was set to 1 cycle of test.

Figure 38:
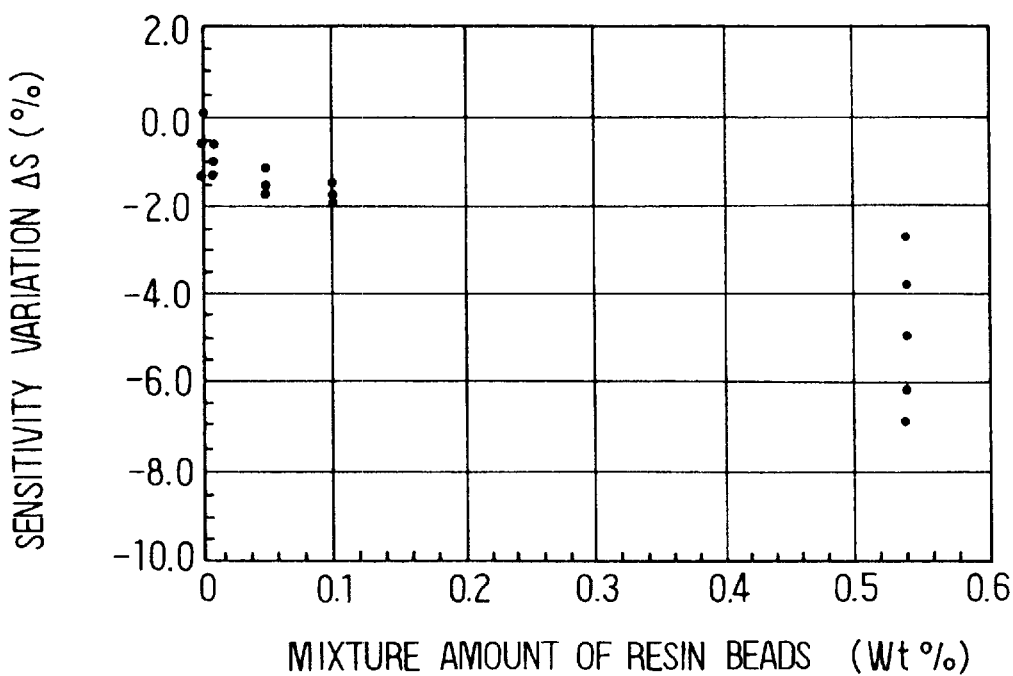
FIG. 38 is a graph showing a result of measuring a relationship between a mixture amount of resin beads and sensitivity variation according to the sixth embodiment of the present invention.

FIG. 38 shows a result of measuring the sensitivity variation ΔS(=(S0−S1)×100/S0(%)) before and after the low temperature leave test, in a state where the amount of mixing the resin beads 51b to the bonding material 51 was changed. It was known from the result that when the sensitivity variation ΔS was set to about ±2% that was a range of accurately detecting the acceleration in a detection region of acceleration of, for example, substantially ±1 G, the mixture amount of the resin beads 51b must be about 0.1 wt % or lower. Incidentally, the lower limit value of the mixture amount may theoretically be set to a value where at least three pieces of the resin beads 51b are arranged at pertinent intervals in the adhering face for securing a space between the weight portion 23 and the seat 26, however, it was found that about 0.03 wt % was a pertinent lower limit value as an empirical value from a relation to an actual process capability.

According to the sixth embodiment constituted as described above, a voltage having a level the same as that of power source voltage applied to the semiconductor sensor chip 21, is applied on the seat 26 via the conductive beads in the group of the resin beads 51b. Accordingly, the potential difference caused between the semiconductor sensor chip 21 and the seat 26 is reduced. That is, when the potential difference is designated by V, the following equation (8) is obtained.

$$v = v_0 \times \left(1 - e^{-\frac{T}{CR}}\right) \quad (8)$$

where Vo designates a potential difference at an initial stage of applying voltage, notation C designates an electrostatic capacitance between the semiconductor sensor chip 21 and the seat 26, notation R designates a resistance value between the semiconductor sensor chip 21 and the seat 26 and notation T designates a time constant.

It is known from the above equation that the potential difference V is lowered in accordance with a reduction in the resistance value R between the semiconductor sensor chip 21 and the seat 26. According to the sixth embodiment, the resistance value between the semiconductor sensor chip 21 and the seat 26 is set to $10^{10}$ Ω or lower and according to such a constitution, the potential difference caused between the semiconductor sensor chip 21 and the seat 26 is sufficiently reduced. Accordingly, the electrostatic attraction caused between the weight portion 23 and the seat 26 is reduced. As a result, deterioration in output characteristic caused by the electrostatic attraction generated at the inside of the G sensor 50 can be prevented whereby a stable output characteristic can be provided. Further, to provide such an effect, only the bonding material 51 having a predetermined electric characteristic is utilized and therefore, simplification of structure can also be realized.

Figure 39:
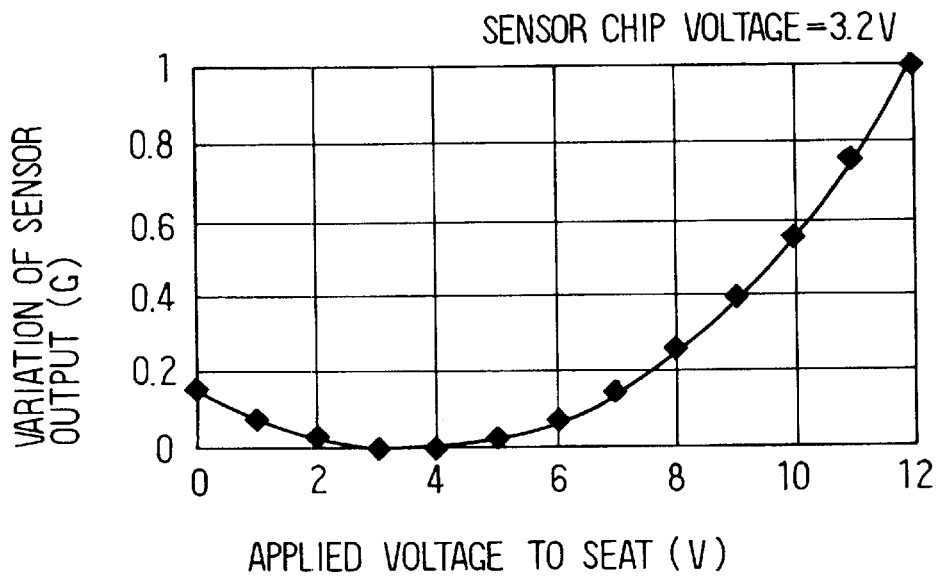
FIG. 39 is a graph showing a result of measuring an amount of variation of a sensor output with respect to a sample where a sensor chip is insulated from a seat according to the sixth embodiment of the present invention.

Incidentally, FIG. 39 shows an experimental result of measuring a variation amount of the sensor output when different levels of voltage are applied on the seat 26 under a state where a voltage of 3.2 V is applied on the semiconductor sensor chip 21 with respect to a sample in a state where the semiconductor sensor chip 21 and the seat 26 are insulated from each other (no conductive bead is included in the group of the resin beads 51b). It is known from the result that the variation of the sensor output is minimized when the potential level of the seat 26 is equal to the potential level of the semiconductor sensor chip 21.

Figure 40:
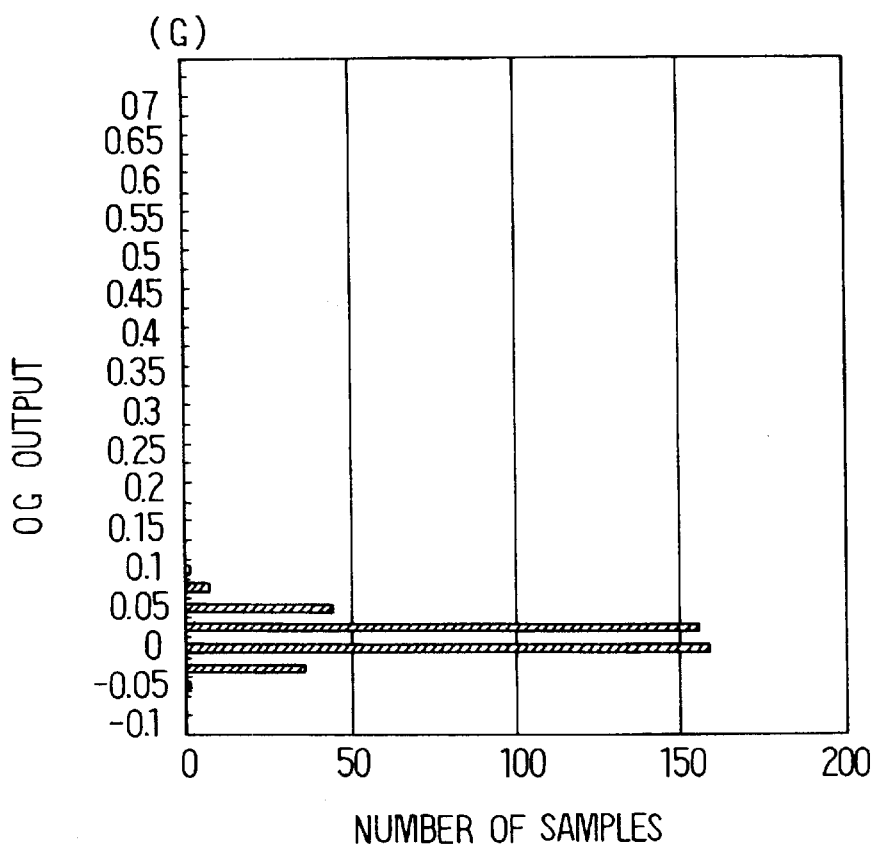
FIG. 40 is a graph showing a result of sampling values of the 0 G output after carrying out a burn-in processing according to the sixth embodiment of the present invention.

Further, FIG. 40 shows a result of sampling a variation state of the 0 G output with respect to a number of the G sensors 50 which have been subjected to a burn-in processing. It is known from FIG. 40 that the variation amount of the 0 G output is reduced for almost all the samples and it is known that the yield is promoted to 97% or more even with a severe requirement in which the variation amount of the 0 G output is allowable up to, for example, only ±0.05 G.

Further, when the constitution in the sixth embodiment is adopted, it is preferable that a compressive force is exerted on the bonding material 51 when the semiconductor sensor chip 21 is adhered to the seat 26 by the bonding material 51. In this way, the electric connection state between the semiconductor sensor chip 21 and the seat 26 by the conductive beads of resin beads 51b can be secured.

Although the conductive beads in which the surface of the resin beads are plated with gold, are used in the sixth embodiment, conductive beads where surfaces of resin beads are plated (coated) with a conductive material such as silver or the like may be used or conductive beads which comprise a metal may be used. Although the bonding material 51 in which the resin beads 51b are mixed in the flexible adhesive agent 51a, is used, a bonding material comprising an adhesive agent and a plurality of beads (including at least one conductive bead) in combination may be used.

A bonding material comprising a conductive adhesive agent for adhering the semiconductor sensor chip 21 to the seat 26 may be used in place of the bonding material 51. Further, a bonding material comprising an adhesive agent for adhering the semiconductor sensor chip 21 to the seat 26 and carbon power mixed to the adhesive agent may be used in place of the bonding material 51. Furthermore, a bonding material comprising a conductive adhering sheet for adhering the semiconductor sensor chip 21 to the seat 26 may be used in place of the bonding material 51.

(Seventh Embodiment)

Figure 41:
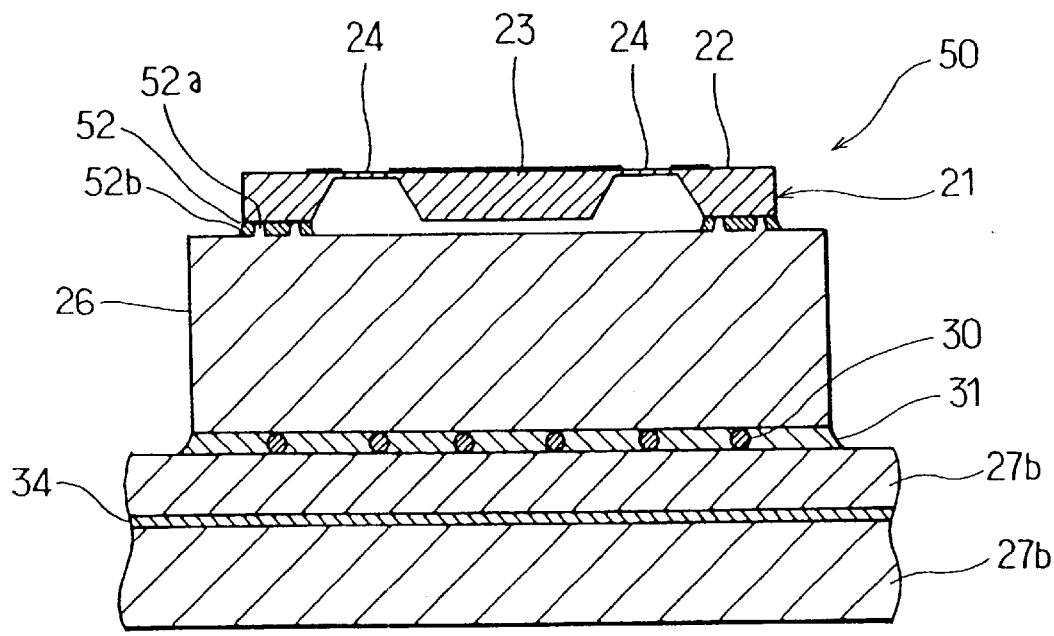
FIG. 41 is a longitudinal sectional view of essential portions according to a seventh embodiment of the present invention.

FIG. 41 shows the seventh embodiment of the present invention formed by modifying the sixth embodiment and an explanation will be given of portions different from those of the sixth embodiment as follows.

The seventh embodiment is featured in that as a supporting member for, supporting the semiconductor sensor chip 21 by the seat 26, in place of the bonding material 51 in the sixth embodiment, there is provided a supporting member 52 comprising, for example, a plurality of projections 52a integrally formed with the seat 26 and a conductive adhesive agent 52b for bringing the semiconductor sensor chip 21 and the seat 26 in contact with each other via the projections 52a. In this case, the projections 52a are formed by etching the seat 26. Further, it is preferable that the conductive adhesive agent 52b having the modulus of elasticity of 500 MPa or lower is used.

According to the seventh embodiment constituted as described above, a voltage having a level the same as that of power source voltage applied on the semiconductor sensor chip 21, is applied on the seat 26 via the projections 52a and the conductive adhesive agent 52b. Therefore, the potential difference caused between the semiconductor sensor chip 21 and the seat 26 is reduced and as a result, an effect the same as that in the sixth embodiment can be achieved. Especially, the seventh embodiment has an advantage where the dimensional control of the air gap between the weight portion 23 of the semiconductor sensor chip 21 and the seat 26 can be conducted by the projections 52a integrally formed with the seat 26.

Incidentally, although according to the seventh embodiment, the projections 52a are formed on the side of the seat 26, the projections may be formed on the side of the frame 22 of the semiconductor sensor chip 21. Further, if the electric conductive state between the semiconductor sensor chip 21 and the seat 26 via the projections 52a, is secured, a normal adhesive agent may be used in place of the conductive adhesive agent 52b.

(Eighth Embodiment)

Figure 42:
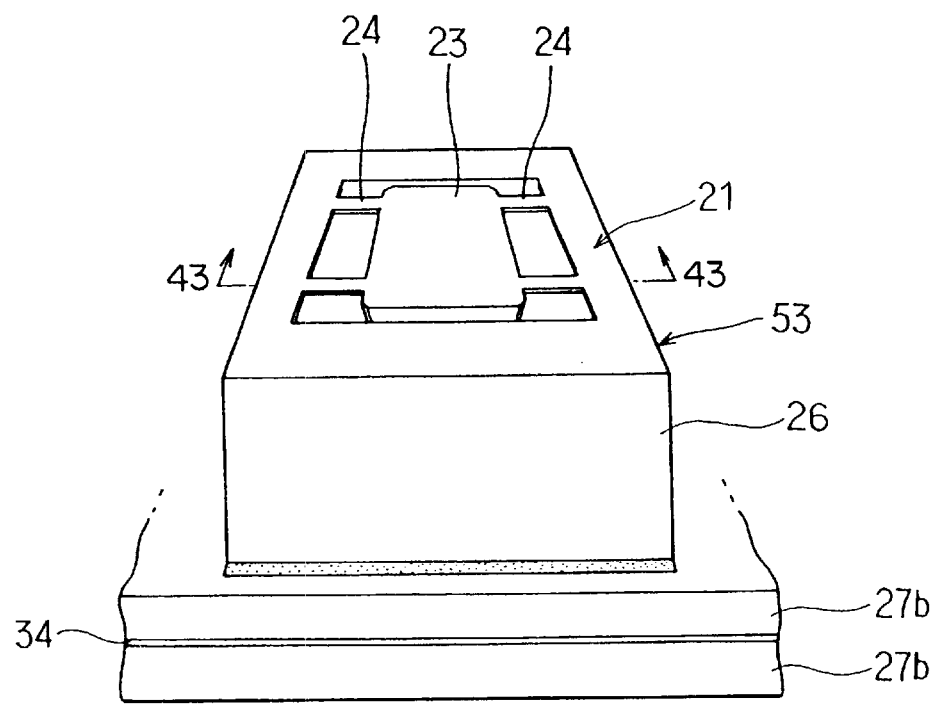
FIG. 42 is a perspective view of essential portions according to an eighth embodiment of the present invention.
Figure 43:
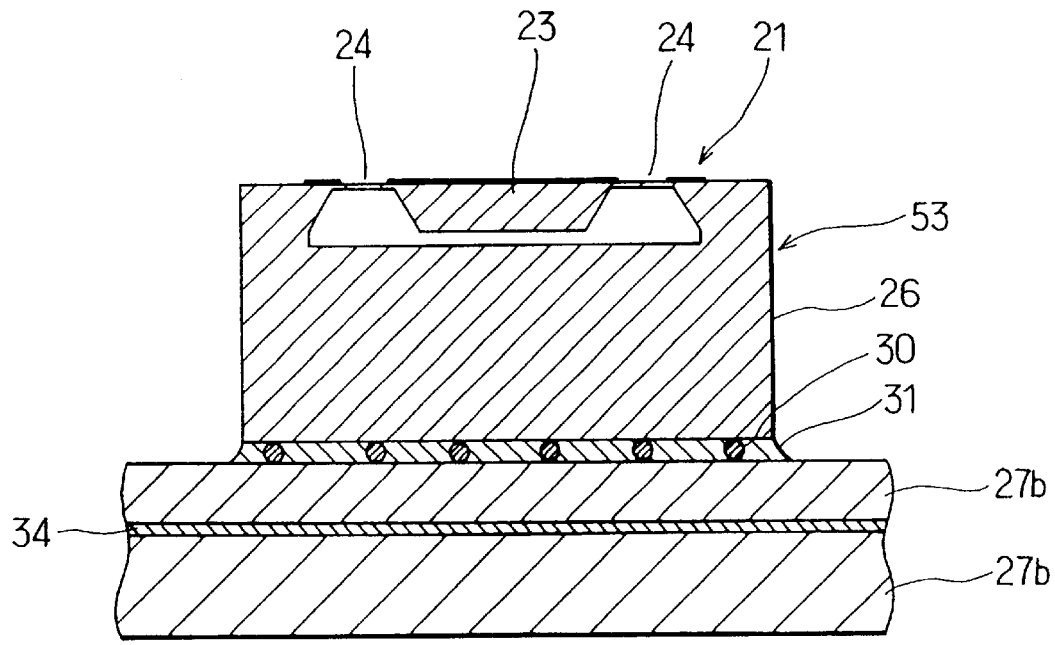
FIG. 43 is a sectional view taken from a line 43—43 of FIG. 42.

FIG. 42 and FIG. 43 show the eighth embodiment of the present invention formed by further modifying the sixth embodiment and an explanation will be given of portions different from those in the sixth embodiment as follows.

Eighth embodiment is featured in that the semiconductor sensor chip 21 and the seat 26 are integrally formed by the same material (for example, silicon single crystal substrate). FIG. 42 shows an outlook of a semiconductor acceleration sensor and FIG. 43 shows a sectional structure taken from a line 43—43 of FIG. 42.

In FIG. 42 and FIG. 43, when a sensor unit 53 which is an integrated body of the semiconductor sensor chip 21 and the seat 26 is fabricated, a process of impurity concentration dependent etching is used. In this case, $P^+$ or $N^+$ region having a high concentration ($10^{19}/cm^3$ or more) is formed by embedding a diffusion region or implanting ions at a portion of a silicon single crystal substrate material which is an object of etching and only the high concentration region is selectively etched by an etching solution of $HF-HNO_3-CH_3COOH$ group by which the sensor unit 53 integrated with the semiconductor sensor chip 21 and the seat 26 is formed.

According to the eighth embodiment constituted as described above, the semiconductor sensor chip 21 and the seat 26 are integrally formed by the same material. Therefore, the potential difference caused between the semiconductor sensor chip 21 and the seat 26 is sufficiently reduced and the electrostatic attraction caused between the weight portion 23 and the seat 26 is significantly reduced. As a result, also in the eighth embodiment, deterioration of the output characteristic caused,by the electrostatic attraction generated at the inside can be prevented and a stable output characteristic can be achieved. Further, according to the eighth embodiment, the bonding material 51 in the sixth embodiment is dispensed with and reduction in a number of parts can be realized.

(Other Embodiments)

Additionally, the present invention is not limited to the embodiments described above, but can be modified or extended as follows.

Although the semiconductor sensor chip 21 or 41 is formed by a silicon single crystal substrate, it may be formed by other material having a large piezoresistance coefficient. The material of the housing 27 and the lid 35 is not limited to ceramic but they may be formed by an insulating material such as glass or a metal. Although the electrostatic shield 34 is installed over the entire region of the bottom face portion in the housing 27, various modes may be embodied in a constitution where the electrostatic shield is provided also at the lid 35, a constitution where the electrostatic shield is provided only at a portion corresponding to the bottom face of the semiconductor sensor chip 21, or a constitution where the electrostatic shield is provided at almost a total of positions covering the sensor chip 21 or the like.

The etching processing for forming the beams 24 or 46 is not limited to an electrochemical stop etching but may be a normal etching processing. Also, an isotropic etching processing may be used in place of the alkali anisotropic etching.

As a base adhesive agent of the flexible adhesive agent 29, 31, 51a or 52b, a flexible epoxy resin or the like may be used other than silicone resin.

The beams may have a constitution of supporting the weight portion at three or fewer than three portions other than the constitution where the beams support the weight portion at four portions in a both supported type or it may be supported at five or more portions. Further, the present invention is applicable to a beam of a cantilever type.

What is claimed is:

1. A semiconductor acceleration sensor comprising:
   a semiconductor sensor chip having a weight portion supported via beams, for detecting an acceleration up to substantially ±1 G by utilizing a piezoresistance effect of resistor elements formed on the beams; and
   a seat which supports the semiconductor sensor chip, the seat being formed by a material having a thermal expansion coefficient equivalent to a thermal expansion coefficient of the semiconductor sensor chip,
   wherein the weight portion is arranged in a vicinity of the seat whereby an air damping operation of the weight portion is carried out, and a dimension of an air gap between the weight portion and the seat is set to 7 µm or more.

2. The semiconductor acceleration sensor according to claim 1, wherein the dimension of the air gap between the weight portion and the seat is set to a range of 7 through 15 µm.

3. The semiconductor acceleration sensor according to claim 2, wherein the semiconductor sensor chip further comprises:
   a frame for supporting the weight portion via the beams; and
   spacers provided between the seat and the frame,
   wherein the dimension of the air gap is controlled by the spacers.

4. The semiconductor acceleration sensor according to claim 3, wherein the spacers comprise resin particles having a predetermined particle size and the seat is adhered to the frame by a flexible adhesive agent in which said resin particles of 0.1 weight % or lower is mixed.

5. The semiconductor acceleration sensor according to claim 1, further comprising:
   voltage applying means for applying on the seat a voltage having a level the same as a level of a power source voltage applied on the semiconductor sensor chip.

6. The semiconductor acceleration sensor according to claim 1, wherein a burn-in processing where an integrated body of the semiconductor sensor chip and the seat supporting the semiconductor sensor chip is exposed in an atmosphere of a predetermined temperature for a predetermined time is executed.

7. The semiconductor acceleration sensor according to claim 1, wherein a thickness dimension of the beams of the semiconductor sensor chip is set to be equal to or more than a predetermined thickness in which a sensitivity variation in a temperature range for using the semiconductor sensor chip is within a predetermined allowable value.

8. The semiconductor acceleration sensor according to claim 1, further comprising:

an electrostatic shield provided at least at a position corresponding to a bottom face of the semiconductor sensor chip, for removing an influence of a static electricity on the semiconductor sensor chip.

9. A semiconductor acceleration sensor comprising:

a semiconductor sensor chip having a weight portion supported via beams, for detecting an acceleration up to substantially ±1 G by utilizing a piezoresistance effect of resistor elements formed on the beams; and a seat which supports the semiconductor sensor chip, the seat being formed by a material having a thermal expansion coefficient equivalent to a thermal expansion coefficient of the semiconductor sensor chip, wherein the weight portion is arranged relative to the seat such that a following equation is satisfied, $$0.01 \leq S/d^2 \leq 0.05$$

where d designates a dimension of an air gap between the seat and the weight portion and S designates a bottom area of the weight portion, by which an air damping operation of the weight portion is carried out.

10. The semiconductor acceleration sensor according to claim 9, wherein the semiconductor sensor chip further comprises:

a frame for supporting the weight portion via the beams; and spacers provided between the seat and the frame, wherein the dimension of the air gap is controlled by the spacers.

11. The semiconductor acceleration sensor according to claim 10, wherein the spacers comprise resin particles having a predetermined particle size and the seat is adhered to the frame by a flexible adhesive agent in which said resin particles of 0.1 weight % or lower is mixed.

12. The semiconductor acceleration sensor according to claim 9, further comprising:

voltage applying means for applying on the seat a voltage having a level equal to a power source voltage applied on the semiconductor sensor chip.

13. The semiconductor acceleration sensor according to claim 9, wherein a burn-in processing is performed in which an integrated body of the semiconductor sensor chip and the seat supporting the semiconductor sensor chip is exposed in an atmosphere of a predetermined temperature for a predetermined time.

14. The semiconductor acceleration sensor according to claim 9, wherein a thickness dimension of the beams of the semiconductor sensor chip is set to be equal to or more than a certain dimension whereby a variation amount of a sensitivity in a temperature range for using the semiconductor sensor chip becomes a predetermined allowable value.

15. The semiconductor acceleration sensor according to claim 9, further comprising:

an electrostatic shield provided at least at a position corresponding to a bottom face of the semiconductor sensor chip, for removing an influence of static electricity in the semiconductor sensor chip.

16. A semiconductor acceleration sensor comprising:

a semiconductor sensor chip having a weight portion supported via beams, for detecting an acceleration up to substantially ±1 G by utilizing a piezoresistance effect of resistor elements formed on the beams;

a seat which supports the semiconductor sensor chip; and a supporting member interposed between the semiconductor sensor chip and the seat, for restraining occurrence of a potential voltage difference between the semiconductor sensor chip and the seat;

wherein the weight portion is arranged in a vicinity of the seat whereby an air damping operation of the weight portion is carried out, and a dimension of an air gap between the weight portion and the seat is set to 7 $\mu$m or more.

17. The semiconductor acceleration sensor according to claim 16, wherein a resistance value between the semiconductor sensor chip and the seat via the supporting member is set to $10^{10}$ Ω or lower.

18. The semiconductor acceleration sensor according to claim 16, wherein the supporting member comprises an adhesive agent for adhering the semiconductor sensor chip and the seat and a plurality of beads mixed to the adhesive agent and at least one of the plurality of beads is formed by a conductive bead.

19. The semiconductor acceleration sensor according to claim 18, wherein the conductive bead is formed by coating a conductive material on a surface of the resin bead.

20. The semiconductor acceleration sensor according to claim 16, wherein the supporting member comprises an adhesive agent for adhering the semiconductor sensor chip and the seat and a carbon powder is mixed to the adhesive agent.

21. The semiconductor acceleration sensor according to claim 16, wherein the supporting member is a conductive adhering sheet for adhering the semiconductor sensor chip and the seat.

22. A semiconductor acceleration sensor comprising:

a semiconductor sensor chip having a weight portion supported by beams, for detecting an acceleration up to substantially ±1 G by utilizing a piezoresistance effect of resistor elements formed on the beams; and a seat for supporting the semiconductor sensor chip, said seat being integrally formed with the semiconductor chip and made of the same material as the semiconductor sensor chip.

23. The semiconductor acceleration sensor according to claim 22, wherein the semiconductor sensor chip and the seat are formed by an impurity concentration dependent etching.

24. A semiconductor acceleration sensor comprising:

a semiconductor sensor element having a weight portion supported via beams, for detecting an acceleration up to substantially ±1 G by utilizing a piezoresistance effect of resistor elements formed on the beams; and a seat interposed between the semiconductor sensor element and a substrate for mounting the semiconductor sensor element, the seat having a thermal expansion coefficient substantially the same as a thermal expansion coefficient of the semiconductor sensor element, wherein a thickness dimension of the seat is set such that a variation rate of a detection sensitivity of the semiconductor sensor element before and after a predetermined thermal stress test is a predetermined allowable value or lower.

25. The semiconductor acceleration sensor according to claim 24, wherein the thickness dimension of the seat is set to 1 mm or more when a chip size of the semiconductor sensor element is substantially 3×3 mm through 4×4 mm.

26. The semiconductor acceleration sensor according o claim 25, wherein the seat is constituted by a semiconductor material that is the same as the semiconductor sensor element.

27. The semiconductor acceleration sensor according to claim 26, wherein each of the beams supports said weight portion at both sides thereof.

28. A semiconductor acceleration sensor comprising:
a semiconductor sensor element having a weight portion supported via beams, for detecting an acceleration up to substantially ±1 G by utilizing a piezoresistance effect of resistor elements formed on the beams;
a seat interposed between the semiconductor sensor element and a substrate for mounting the semiconductor sensor element, the seat having a thermal expansion coefficient substantially the same as a thermal expansion coefficient of the semiconductor sensor element; and
an adhesive agent for fixing the semiconductor sensor element to the seat, the adhesive agent including a flexible resin as a base material and resin particles having a predetermined particle size, the resin particles being mixed with the base material such that a weight percent thereof becomes 0.1 weight % or lower.

29. The semiconductor acceleration sensor according to claim 28, wherein a thickness dimension of the seat is set to 1 mm or more when a chip size of the semiconductor sensor element is substantially 3×3 mm through 4×4 mm.

30. The semiconductor acceleration sensor according to claim 29, wherein the seat is constituted by a semiconductor material that is the same as the semiconductor sensor element.

31. The semiconductor acceleration sensor according to claim 30, wherein each of the beams supports the weight portion at both sides thereof.

32. The semiconductor acceleration sensor according to claim 28, wherein a thickness dimension of the seat is set such that a variation rate of a detection sensitivity of the semiconductor sensor element before and after a predetermined thermal stress test is a predetermined allowable value or lower.

33. A semiconductor acceleration sensor comprising:
a semiconductor sensor element having a weight portion supported via beams, for detecting an acceleration up to substantially ±1 G by utilizing a piezoresistance effect of resistor elements formed on the beams,
wherein a thickness dimension of the beams of the semiconductor sensor element is set to be equal to or more than a predetermined thickness at which sensitivity variation within a temperature range of the semiconductor sensor chip is a predetermined allowable value.

34. The semiconductor acceleration sensor according to claim 33, wherein the temperature range for using the semiconductor sensor chip is set to ±60° C. with a mean environment temperature as a reference temperature.

35. The semiconductor acceleration sensor according to claim 34, wherein the allowable value of the variation amount of the sensitivity is 5 through 6%.

36. The semiconductor acceleration sensor according to claim 33, wherein a thickness dimension of the beams of the semiconductor sensor element is set to 4.2 $\mu$m or more.

37. The semiconductor acceleration sensor according to claim 33, wherein a thickness dimension of the beams of the semiconductor sensor element is set to 4.5 $\mu$m through 5.5 $\mu$m.

38. The semiconductor acceleration sensor according to claim 33, wherein each of the beams supports the weight portion at both sides thereof.

39. A semiconductor acceleration sensor comprising:
a semiconductor sensor element having a weight portion supported via beams, for detecting an acceleration up to substantially ±1 G by utilizing a piezoresistance effect of resistor elements formed on the beams,
wherein a thickness dimension of the beams of the semiconductor sensor element is set to be equal to or more than a predetermined thickness in which a temperature coefficient value TCS at which a sensitivity variation rate of a sensitivity per degree becomes ±800 ppm.

40. The semiconductor acceleration sensor according to claim 39, wherein the thickness dimension of the beams of the semiconductor sensor element is set to 4.2 $\mu$m or more.

41. The semiconductor acceleration sensor according to claim 39, wherein the thickness dimension of the beams of the semiconductor sensor element is set to 4.5 $\mu$m through 5.5 $\mu$m.

42. The semiconductor acceleration sensor according to claim 39, wherein each of the beams supports the weight portion at both sides thereof.

43. A semiconductor acceleration sensor comprising:
a semiconductor sensor element having a weight portion supported via beams, for detecting an acceleration up to substantially ±1 G by utilizing a piezoresistance effect of resistor elements formed on the beams;
a seat formed by a material having a thermal expansion coefficient equivalent to a thermal expansion coefficient of the semiconductor sensor element and arranged at a vicinity of the weight portion whereby the weight portion caries out an air damping operation;
an inner frame for supporting the weight portion via the beams; and
an outer frame fixed to the seat, for supporting the inner frame via a thick connecting portion,
wherein a thickness dimension of the beams of the semiconductor sensor element is set to be equal to or more than a predetermined thickness at which a sensitivity variation within a temperature range of the semiconductor sensor element is a predetermined allowable value.

44. The semiconductor acceleration sensor according to claim 43, wherein the temperature range for using the semiconductor sensor element is set to ±60° C. with a mean environment temperature as a reference temperature.

45. The semiconductor acceleration sensor according to claim 43, wherein the allowable value of the variation amount of the sensitivity is 1 through 2%.

46. The semiconductor acceleration sensor according to claim 43, wherein the thickness dimension of the beams of the semiconductor sensor element is set to 3.2 $\mu$m through 6.0 $\mu$m.

47. A semiconductor acceleration sensor comprising:
a semiconductor sensor element having a weight portion supported via beams, for detecting an acceleration up to substantially ±1 G by utilizing a piezoresistance effect of resistor elements formed on the beams;

a seat formed of a material having a thermal expansion coefficient equivalent to a thermal expansion coefficient of the semiconductor sensor element and arranged in a vicinity of the weight portion, the weight portion carrying out an air damping operation;

an inner frame for supporting the weight portion via the beams;

an outer frame fixed to the seat, for supporting the inner frame via a thick connecting portion, wherein a thickness dimension of the beams of the semiconductor sensor element is set to be equal to or more than a certain dimension when a temperature coefficient value TCS of a sensitivity indicating a variation rate of the sensitivity per degree becomes ±800 ppm.

48. The semiconductor acceleration sensor according to claim 47, wherein the thickness dimension of the beams of the semiconductor sensor element is set to be equal to or more than a predetermined thickness in which the temperature coefficient value TCS at which a sensitivity variation rate of the sensitivity per degree becomes ±200 ppm.

49. The semiconductor acceleration sensor according to claim 47, wherein the thickness dimension of the beams of the semiconductor sensor element is set to 3.2 μm through 6.0 μm.

50. A semiconductor acceleration sensor according to claim 1, wherein the dimension of the air gap between the weight portion and the seat is set to a range of 10 through 22 μm.

* * * * *